United States Patent
Hayashi et al.

(10) Patent No.: US 9,871,188 B2
(45) Date of Patent: Jan. 16, 2018

(54) PIEZOELECTRIC CERAMIC, METHOD FOR MANUFACTURING THE SAME, PIEZOELECTRIC ELEMENT, AND ELECTRONIC APPARATUS

(71) Applicant: CANON KABUSHIKI KAISHA, Tokyo (JP)

(72) Inventors: Jumpei Hayashi, Yokohama (JP); Takayuki Watanabe, Yokohama (JP); Akira Uebayashi, Tokyo (JP); Kenichi Takeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 537 days.

(21) Appl. No.: 14/606,401

(22) Filed: Jan. 27, 2015

(65) Prior Publication Data

US 2015/0214469 A1    Jul. 30, 2015

(30) Foreign Application Priority Data

Jan. 29, 2014 (JP) .................................. 2014-014470

(51) Int. Cl.
*H01L 41/187* (2006.01)
*B06B 1/06* (2006.01)
(Continued)

(52) U.S. Cl.
CPC .......... *H01L 41/257* (2013.01); *B06B 1/0644* (2013.01); *B41J 2/14201* (2013.01);
(Continued)

(58) Field of Classification Search
CPC ............... H01L 41/257; H01L 41/0973; H01L 41/1871; H01L 41/43; B06B 1/0644; B41J 2/14201; C04B 35/4682; C04B 35/6261; C04B 35/62655; C04B 35/62695; C04B 35/64; G02B 27/0006; H02N 2/163
(Continued)

(56) References Cited

U.S. PATENT DOCUMENTS

| | | | |
|---|---|---|---|
| 7,652,408 B2 | 1/2010 | Fujii | |
| 9,136,460 B2* | 9/2015 | Hayashi | ............... B41J 2/14233 |
| 2005/0253510 A1* | 11/2005 | Nasu | ..................... H05B 33/22 |
| | | | 313/509 |

FOREIGN PATENT DOCUMENTS

| | | |
|---|---|---|
| CN | 101621112 A | 1/2010 |
| CN | 102153344 A | 8/2011 |

(Continued)

OTHER PUBLICATIONS

U.S. Appl. No. 14/606,399, filed Jan. 27, 2015.
Japanese Journal of Applied Physics, 2010, vol. 49, 09MD03-1 to 09MD03-4.

*Primary Examiner* — Thomas Dougherty
(74) *Attorney, Agent, or Firm* — Canon U.S.A. Inc., IP Division

(57) ABSTRACT

A piezoelectric ceramic includes a perovskite-type metal oxide containing barium titanate, and Mn. When a surface thereof along the remanent polarization direction is subjected to X-ray diffraction analysis at room temperature, the ratio of the diffraction intensity of the (002) plane to the diffraction intensity of the (200) plane is 1.0 or more, the diffraction peak of the (002) plane has a half width of 1.2° or less, and the lattice constant of the c-axis thereof and the lattice constant of the a-axis thereof satisfy the relationship $1.004 \leq c/a \leq 1.010$.

24 Claims, 16 Drawing Sheets

(51) Int. Cl.
    *H01L 41/257* (2013.01)
    *B41J 2/14* (2006.01)
    *G02B 27/00* (2006.01)
    *C04B 35/468* (2006.01)
    *C04B 35/626* (2006.01)
    *C04B 35/64* (2006.01)
    *H01L 41/43* (2013.01)
    *H01L 41/09* (2006.01)
    *H02N 2/16* (2006.01)

(52) U.S. Cl.
    CPC ...... *C04B 35/4682* (2013.01); *C04B 35/6261* (2013.01); *C04B 35/62655* (2013.01); *C04B 35/62695* (2013.01); *C04B 35/64* (2013.01); *G02B 27/0006* (2013.01); *H01L 41/0973* (2013.01); *H01L 41/1871* (2013.01); *H01L 41/43* (2013.01); *H02N 2/163* (2013.01); *C04B 2235/3208* (2013.01); *C04B 2235/3244* (2013.01); *C04B 2235/3262* (2013.01); *C04B 2235/3263* (2013.01); *C04B 2235/3298* (2013.01); *C04B 2235/604* (2013.01); *C04B 2235/6565* (2013.01); *C04B 2235/77* (2013.01); *C04B 2235/786* (2013.01); *C04B 2235/787* (2013.01); *C04B 2235/79* (2013.01); *Y10T 29/42* (2015.01)

(58) Field of Classification Search
    USPC .................. 310/358; 252/62.92 R, 62.92 PZ; 501/134
    See application file for complete search history.

(56) References Cited

FOREIGN PATENT DOCUMENTS

| | | |
|---|---|---|
| EP | 2141752 A1 | 1/2010 |
| JP | H07-202291 A | 8/1995 |
| JP | H10-279352 A | 10/1998 |
| JP | 2009-215111 A | 9/2009 |
| JP | 2010-030875 A | 2/2010 |
| JP | 2011-132121 A | 7/2011 |
| JP | 2013-199398 A | 10/2013 |
| JP | 2013-219316 A | 10/2013 |
| WO | 2013/005701 A1 | 1/2013 |
| WO | 2013/005702 A1 | 1/2013 |

* cited by examiner

PIEZOELECTRIC CERAMIC, METHOD FOR MANUFACTURING THE SAME, PIEZOELECTRIC ELEMENT, AND ELECTRONIC APPARATUS

BACKGROUND OF THE INVENTION

Field of the Invention

The present application relates to a lead- and alkali metal-free piezoelectric ceramic and a method for manufacturing the same. The present application also relates to a piezoelectric element, a vibration device, a liquid ejecting head, a liquid ejecting apparatus, an ultrasonic motor, an optical apparatus, a vibration unit, a dust removing unit, an image sensing apparatus and an electronic apparatus, each using the piezoelectric ceramic.

Description of the Related Art

Piezoelectric ceramics are typically metal oxides having a perovskite structure, such as lead zirconate titanate (hereinafter referred to as PZT). PZT however contains lead, which impacts on environment. This is an issue. Accordingly, lead-free piezoelectric ceramics are desired.

Barium titanate has been known as a lead-free piezoelectric ceramic. Also, in order to improve the characteristics of the lead-free piezoelectric ceramic, barium titanate-based materials have been being developed.

Japanese Patent Laid-Open No. 2009-215111 discloses a barium titanate-based piezoelectric ceramic in which Ca is substituted for part of the A site of barium titanate and Zr is substituted for part of the B site of the barium titanate to enhance the piezoelectric properties of the barium titanate. Such a material is superior to barium titanate in terms of piezoelectric constant, but has a low mechanical quality factor.

Japanese Journal of Applied Physics, 2010, vol. 49, 09MD03-1 to 09MD03-4, discloses barium titanate-based materials containing Ca substituted for part of the A site of barium titanate and further containing Mn and Fe, or Cu. Such a material is superior to barium titanate in terms of mechanical quality factor, but the electromechanical coupling factor $k_{31}$ thereof is as low as 0.119.

The piezoelectric ceramics in the known art do not satisfy both the demands for mechanical quality factor and electromechanical coupling factor, and piezoelectric elements using such a piezoelectric ceramic undesirably consume large power.

SUMMARY OF THE INVENTION

The present application provides a lead- and alkali metal-free piezoelectric ceramic having a high mechanical quality factor and exhibiting low power consumption, and a method for manufacturing the piezoelectric ceramic. The present application also provides a piezoelectric element, a vibration device, a liquid ejecting head, a liquid ejecting apparatus, an ultrasonic motor, an optical apparatus, a vibration unit, a dust removing unit, an image sensing device and an electronic apparatus, each using the piezoelectric ceramic.

A piezoelectric ceramic according to an embodiment of the application has a remanent polarization. The piezoelectric ceramic contains a perovskite-type metal oxide containing barium titanate, and Mn. When a surface of the piezoelectric ceramic along the direction of the remanent polarization is subjected to X-ray diffraction analysis at room temperature, the ratio of the diffraction intensity of the (002) plane to the diffraction intensity of the (200) plane is 1.0 or more, and the diffraction peak of the (002) plane has a half width of 1.2° or less. Also, the lattice constant c of the c-axis of the piezoelectric ceramic and the lattice constant a of the a-axis thereof satisfy the relationship: $1.004 \leq c/a \leq 1.010$.

A method for manufacturing a piezoelectric ceramic according to an embodiment of the application is intended to produce the above-described piezoelectric ceramic. The method includes the step of forming a compact of a raw material powder; and the step of sintering the compact to yield the piezoelectric ceramic. The step of sintering includes heating the compact at temperatures up to a maximum temperature of 1100° C. to 1400° C., and cooling the compact at a cooling rate of 50° C./h or more.

A piezoelectric element according to an embodiment of the application includes a first electrode, a piezoelectric material portion made of the piezoelectric ceramic, and a second electrode. The first and the second electrode intersect the direction of the remanent polarization of the piezoelectric ceramic.

A method for manufacturing a piezoelectric element according to an embodiment of the application intended to manufacture the above-described piezoelectric element. The method includes the step of forming a compact of a raw material powder, the step of sintering the compact to yield a piezoelectric ceramic, the step of forming a first and a second electrode on the piezoelectric ceramic, and the step of polarizing the piezoelectric ceramic. The step of forming the first and the second electrode includes heating the piezoelectric ceramic and the first and second electrodes at temperatures up to a maximum temperature of 700° C. to 900° C., and cooling the piezoelectric ceramic and the first and second electrodes at a cooling rate of 100° C./h or more.

A vibration device according to an embodiment of the present application includes the piezoelectric element and a diaphragm on which the piezoelectric element is disposed. When the surface of the piezoelectric ceramic of the piezoelectric material portion closer to the diaphragm is the bottom surface thereof and the surface of the piezoelectric ceramic opposite the bottom surface is the front surface thereof, the (002)/(200) diffraction intensity ratio A of the measurement surface in the vicinity of the bottom surface and the (002)/(200) diffraction intensity ratio B of the measurement surface in vicinity of the front surface satisfy the relationship A>B at room temperature.

A liquid ejecting head according to an embodiment of the application includes a liquid chamber including a vibration portion provided with the above-described piezoelectric element, and a portion defining an ejection opening communicating with the liquid chamber.

A liquid ejecting head according to an embodiment of the application includes a liquid chamber including a vibration portion provided with the above-described vibration device, and a portion defining an ejection opening communicating with the liquid chamber.

A liquid ejecting apparatus according to an embodiment of the present application includes a portion on which a transfer medium is placed, and the liquid ejecting head.

An ultrasonic motor according to an embodiment of the application includes the above-described vibration device, and a moving device in contact with the vibration device.

An optical apparatus according to an embodiment includes a driving portion provided with the ultrasonic motor.

A vibration unit according to an embodiment of the present application includes a vibration device including the above-described piezoelectric element and a diaphragm on which the piezoelectric element is disposed.

A dust removing unit according to an embodiment of the present application includes a vibration portion provided with the vibration unit.

An image sensing apparatus according to an embodiment of the present application includes a dust removing unit, and an image sensing element unit having a light-receiving face. The dust removing unit is disposed at the light receiving face of the image sensing unit.

An electronic apparatus according to an embodiment of the present application includes a piezoelectric acoustic component including the above-described piezoelectric element.

The present application provides a lead- and alkali metal-free piezoelectric ceramic having a high mechanical quality factor and exhibiting low power consumption, and a method for manufacturing the piezoelectric ceramic.

The present application also provides a piezoelectric element, a vibration device, a liquid ejecting head, a liquid ejecting apparatus, an ultrasonic motor, an optical apparatus, a vibration unit, a dust removing unit, an image sensing apparatus and an electronic apparatus, each using the piezoelectric ceramic.

Further features of the present invention will become apparent from the following description of exemplary embodiments with reference to the attached drawings.

DESCRIPTION OF THE EMBODIMENTS

Figure 1:
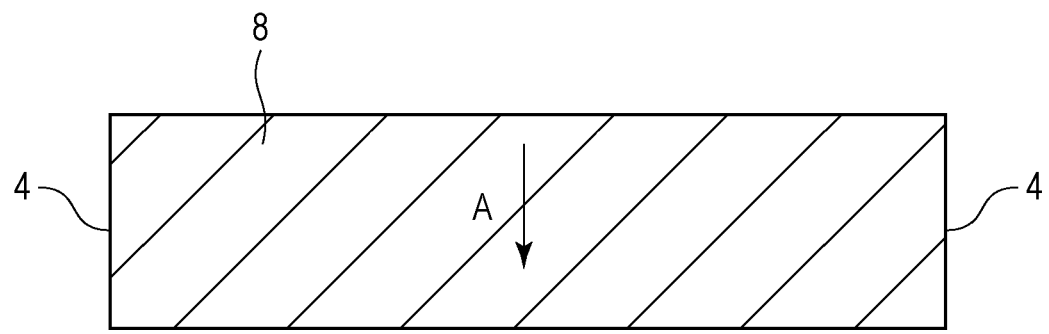
FIG. 1 is a sectional view of a piezoelectric ceramic according to an embodiment of the present application.

Some embodiments of the application will now be described.

A piezoelectric ceramic according to an embodiment has a remanent polarization and contains a perovskite-type metal oxide containing barium titanate, and Mn. When a surface thereof along the direction of the remanent polarization is subjected to X-ray diffraction analysis at room temperature, the ratio of the diffraction intensity of the (002) plane to the diffraction intensity of the (200) plane (hereinafter referred to as (002)/(200) diffraction intensity ratio) is 1.0 or more, the diffraction peak of the (002) plane has a half width of 1.2° or less, and the lattice constant c of the c-axis thereof and the lattice constant a of the a-axis thereof satisfy the relationship $1.004 \leq c/a \leq 1.010$.

In the present embodiment, a lead- and alkali metal-free piezoelectric ceramic having a high mechanical quality factor and exhibiting low power consumption is provided by controlling the crystal structure of a barium titanate-based ceramic.

The piezoelectric ceramic of the present embodiment contains a perovskite-type metal oxide containing barium titanate, and Mn.

The perovskite structure of a perovskite-type metal oxide used in the present embodiment refers to that ideally having a cubic system structure as described in Iwanami Dictionary of Physics and Chemistry, 5th edition (in Japanese, Iwanami Shoten Publishers, 1998). Metal oxides having the perovskite structure is generally expressed a formula $ABO_3$. The elements A and B in the perovskite structure are present in the form of ions in the A site and the B site respectively. For example, in the case of a unit cell of a cubic system, element A lies at the vertexes of a cube and element B lies at the center of the cube. Element O lie at the centers of the faces of the cube in the form of negative oxygen ions. The perovskite-type metal oxide containing barium titanate is expressed by the chemical formula $BaTiO_3$. It can be confirmed by crystal structure analysis by, for example, X-ray diffraction or electron diffraction that the piezoelectric ceramic has a perovskite structure. If elements A and B and the oxygen element are each displaced in terms of coordinate from the corresponding positions of the unit cell, the unit cell of the perovskite structure is distorted into, for example, tetragonal, rhombohedral or orthorhombic crystal. From the viewpoint of obtaining a piezoelectric ceramic having a good electromechanical coupling factor, it is advantageous that the perovskite-type metal oxide has a tetragonal crystal structure at room temperature.

The piezoelectric ceramic of the present embodiment contains Mn. This increases the mechanical quality factor Qm at room temperature. The term mechanical quality factor Qm of a piezoelectric ceramic refers to a coefficient representing the elastic loss by vibration when the piezoelectric ceramic is evaluated as a piezoelectric oscillator. The magnitude of the mechanical quality factor Qm is defined by the sharpness of the resonance curve in impedance measurement. Hence, the mechanical quality factor is a constant representing the sharpness of the resonance of a piezoelectric oscillator. When a piezoelectric element using the piezoelectric ceramic is operated around the resonant frequency, the element is displaced in proportion to the magnitude of the mechanical quality factor Qm.

The Mn content in terms of metal may be in the range of 0.04 parts by weight to 0.50 parts by weight relative to 100 parts by weight of the perovskite-type metal oxide. In the description herein, the content of an accessory component such as Mn in terms of metal is the proportion of the weight of the accessory component to 100 parts by weight of the metal oxide that is the main constituent of the piezoelectric ceramic, converted from the total weight of the elements constituting the metal oxide measured by X-ray fluorescence analysis (XRF), ICP emission spectroscopy, atomic absorption spectrometry or the like.

When the Mn content is in the above range, the piezoelectric ceramic can provide satisfactory displacement. If the Mn content is less than 0.04 parts by weight, the mechanical quality factor Qm at room temperature can be reduced to less than 400. A piezoelectric ceramic having a mechanical quality factor Qm of less than 400 at room temperature cannot provide sufficient displacement even around the resonant frequency, and consequently requires a larger input voltage to drive the piezoelectric ceramic. Thus the power consumption (driving electric power) of the piezoelectric ceramic can be increased. On the other hand, if the Mn content is higher than 0.50 parts by weight, the electromechanical coupling factor $k_{31}$ of the piezoelectric ceramic decreases to increase the input voltage required to drive the piezoelectric ceramic. This can undesirably increase the power consumption. Desirably, the mechanical quality factor Qm is 800 or more. When it is 800 or more, power consumption is not increased. More desirably, the mechanical quality factor Qm is 1200 or more.

The power consumption used herein refers to the power consumed by the piezoelectric ceramic and is represented by the sum of the power consumed by driving the piezoelectric ceramic and the power consumed in proportion to the capacitance of the piezoelectric ceramic. The power consumed by driving the piezoelectric ceramic is hereinafter referred to as driving electric power, and the power consumed in proportion to the capacitance of the piezoelectric ceramic is referred to as capacitance electric power. The driving electric power of a piezoelectric ceramic tends to decrease when the piezoelectric ceramic has a high electromechanical coupling factor $k_{31}$ or a high mechanical quality factor Qm. On the other hand, the capacitance electric power tends to decrease when the piezoelectric ceramic has a low relative dielectric constant $\in r$ and a high electromechanical coupling factor $k_{31}$.

The power consumption of the piezoelectric ceramic of the present embodiment can be measured using electrodes attached thereto with a power meter. The capacitance electric power (CW) is proportional to the product of the capacitance (C) and driving frequency (f) of the piezoelectric ceramic and applied voltage (V), multiplied by $2\pi$. The driving electric power can be determined by subtracting the capacitance electric power from the reading on a power meter.

The relative dielectric constant $\in r$ of the piezoelectric ceramic can be calculated using the capacitance measured with an impedance analyzer or an LCR meter.

The electromechanical coupling factor $k_{31}$ and mechanical quality factor Qm of the piezoelectric ceramic can be determined by calculation using the measurements of resonant frequency and anti-resonant frequency measured with an impedance analyzer in accordance with a standard (JEITA EM-4501) of Japan Electronics and Information Technology Industries Association. This method is called resonance-anti-resonance method.

The piezoelectric ceramic of the present embodiment has a remanent polarization.

The term remanent polarization refers to the polarization remaining in the piezoelectric ceramic when external electric field is not applied thereto. The spontaneous polarization of a piezoelectric ceramic is oriented in a certain direction by polarizing the piezoelectric ceramic, thereby producing remanent polarization. It can be known whether or not the piezoelectric ceramic has a remanent polarization, by applying a voltage to the piezoelectric ceramic and measuring the relationship between the applied electric field E and the amount P of polarization (P-E hysteresis curve).

When the surface of the piezoelectric ceramic of the present embodiment along the remanent polarization direction (hereinafter referred to as the measurement surface) is subjected to X-ray diffraction analysis at room temperature, the ratio of the diffraction intensity of the (002) plane to the diffraction intensity of the (200) plane is 1.0 or more. Advantageously, it is 1.06 or more.

FIG. 1, which is a sectional view of a piezoelectric ceramic according to an embodiment, shows a rectangular piezoelectric ceramic 8. In the figure, arrow A indicates the remanent polarization direction, and the surface 4 along the remanent polarization direction of the piezoelectric ceramic 8 is the measurement surface subjected to X-ray diffraction analysis. The shape of the piezoelectric ceramic 8 is not limited to rectangular parallelepiped, and may be in circular or polyhedral shape.

Figure 2:
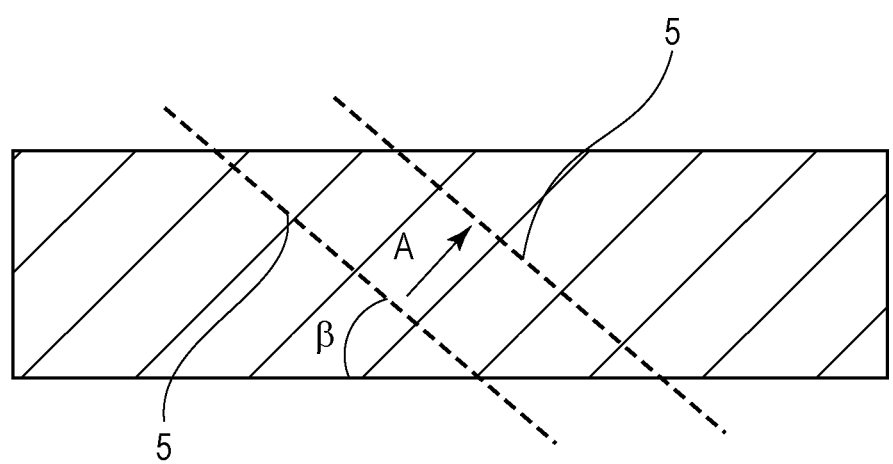
FIG. 2 is a schematic representation illustrating how to determine the direction of the remanent polarization of a piezoelectric ceramic of an embodiment.

The remanent polarization direction can be determined by the following method. FIG. 2 illustrates the method, in which arrow A designates the remanent polarization direction. First, a polarized piezoelectric ceramic is cut out at an angle β (a multiple of 10, satisfying 0°≤β<360°). The cut surfaces 5 are provided with electrodes thereon, and the piezoelectric constant is measured using the electrodes. This measurement is repeated for different β values for examining the β dependence of the piezoelectric constant. The remanent polarization direction is parallel to an angle (β+90°) of the sum of 90° and an angle β at which the piezoelectric constant comes to the largest. The β at which the piezoelectric constant comes to the largest may contain an error of ±10° in view of cutting dimension error and measurement error. The use of a d33 meter facilitates the measurement of the piezoelectric constant.

In the piezoelectric ceramic of the present embodiment, when the measurement surface is subjected to X-ray diffraction analysis, the ratio of the diffraction intensity of (002) plane to the diffraction intensity of the (200) plane (hereinafter referred to as the (002)/(200) diffraction intensity ratio) is 1.0 or more. In this measurement, the diffraction intensities of the (002) and (200) planes are the maximum intensities of the diffraction peaks corresponding to the (002) and (200) planes in pseudo-cubic notation, respectively, measured by the 2θ-θ method. The positions of the diffraction peaks of the (002) and (200) planes can be determined by comparing the X-ray diffraction spectrum of the piezoelectric ceramic and known data of barium titanate (for example, ICDD (the International Centre for Diffraction Data, PDF-2 No. 05-0626). In an X-ray diffraction analysis of the measurement surface of a rectangular piezoelectric element prepared by providing the piezoelectric ceramic shown in FIG. 1 with electrodes on surfaces thereof intersecting the polarization direction, the fact that the (002)/(200) diffraction intensity ratio is 1.0 or more suggests that the piezoelectric ceramic at the measurement surface contains more c-domains than a-domains when observed from the measurement surface. In this state, the piezoelectric ceramic of the present embodiment has a satisfactory mechanical quality factor Qm in a direction perpendicular to the direction of electric field application. Accordingly, the driving electric power of a piezoelectric element using the piezoelectric ceramic of an embodiment of the present application can be reduced by driving the element in a direction perpendicular to the direction of electric field application. On the other hand, if the (002)/(200) diffraction intensity ratio is less than 1.0 when the measurement surface is subjected to X-ray diffraction analysis at room temperature, that is, if the piezoelectric ceramic at the measurement surface contains more a-domains than c-domains when observed from the measurement surface, the mechanical quality factor Qm in a direction perpendicular to the direction of electric field application decreases. The term domain refers to a region in which the direction of spontaneous polarization is aligned. Room temperature is generally is 25° C. In the description herein, however, room temperature refers to temperatures in the range of 20° C. to 30° C., in which the piezoelectric ceramic has substantially the same properties and effects as at 25° C.

Figure 3:
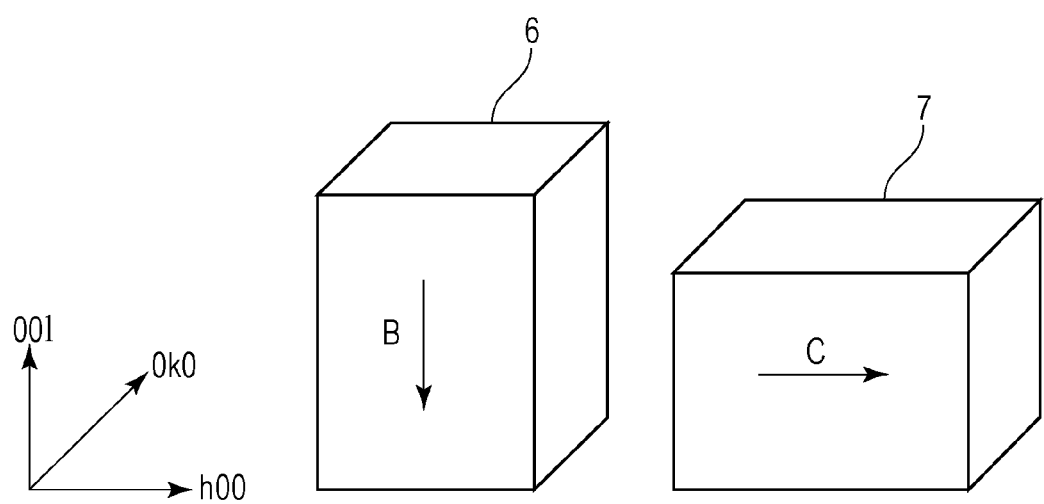
FIG. 3 is a conceptual representation illustrating the a domain and c domain of the crystal grains in the piezoelectric ceramic of an embodiment.

FIG. 3 is a schematic view illustrating the a-domain and c-domain of the crystal grains in the piezoelectric ceramic of the present embodiment. FIG. 3 shows the concepts of the a-domain and c-domain of a tetragonal piezoelectric ceramic, wherein arrows B and C designate spontaneous polarization directions. The a-domain refers to a domain in a tetragonal system in which spontaneous polarization is oriented in the [h00] or [0k0] direction and a direction reverse thereto. The c-domain refers to a domain in which spontaneous polarization is oriented in the [001] direction and the direction reverse thereto. The spontaneous polarization in tetragonal barium titanate is oriented in the c-axis. When there are more c-domains than a-domains in observation from an electrode surface, the piezoelectric ceramic of the present embodiment has a satisfactory electromechanical coupling factor $k_{31}$ as a whole. It is therefore advantageous for the piezoelectric ceramic of the present embodiment that the (002)/(200) diffraction intensity ratio be 1.0 or more when the surface intersecting the remanent polarization direction is subjected to X-ray diffraction analysis at room temperature.

Desirably, the crystal structure of the surface intersecting the remanent polarization direction is estimated by a method not affected by work strain. This is because the piezoelectric ceramic of the present embodiment mainly made of a perovskite-type metal oxide containing barium titanate having a higher Young's modulus than PZT and is accordingly likely to undergo work strain (may be referred to as dislocation) around the surface to be worked, by, for example, polishing, grinding, shaving, or cutting off. It is therefore advantageous to perform finishing by buffing using colloidal silica. Such buffing can lead to a smooth surface having a surface roughness of 200 nm or less. In this operation, the surface worked is desirably removed at a depth of 10 μm or more. The surface roughness can be measured with a stylus surface roughness tester in accordance with JIS B 0651-2001. The surface roughness mentioned herein refers to center line average surface roughness Ra.

The conditions for X-ray diffraction analysis are not particularly limited, and it may be performed by a 2θ-θ method using a parallel beam, or any other conventional method. X-ray diffraction analysis is typically performed as below.

Figure 4:
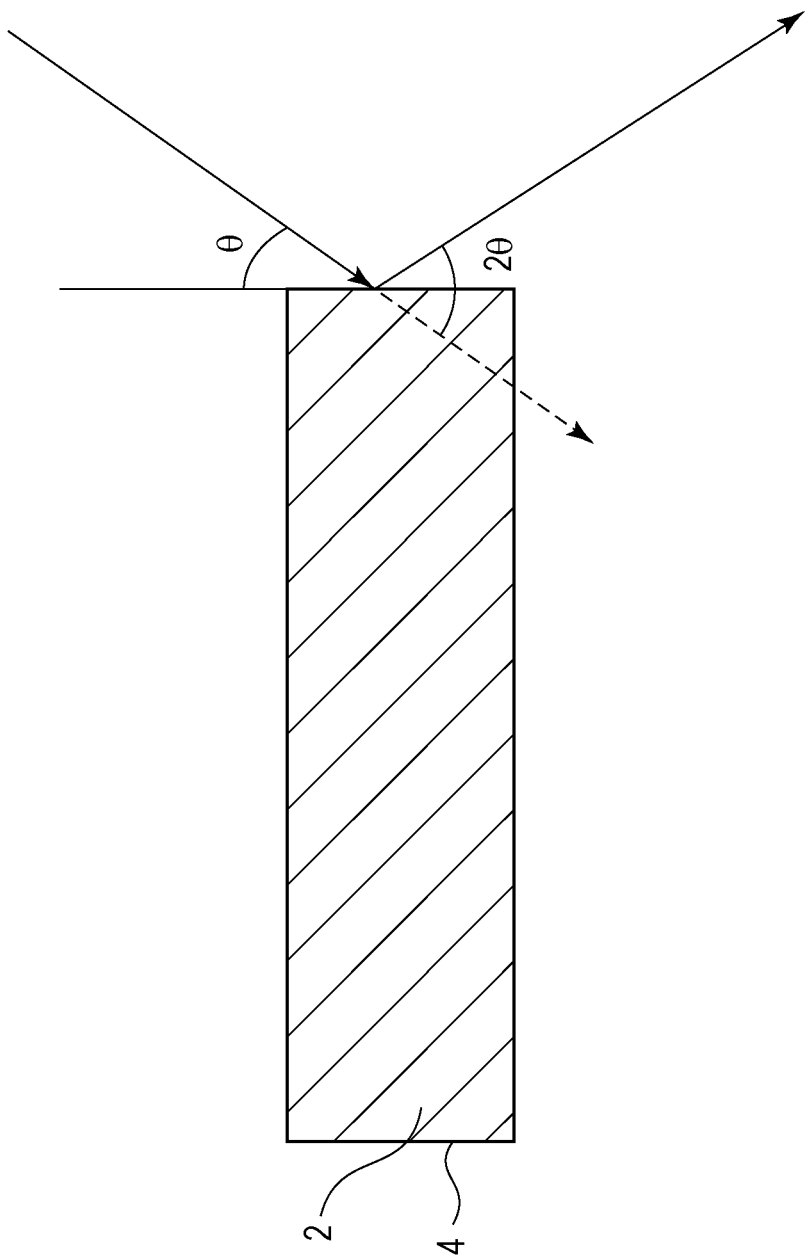
FIG. 4 is a schematic representation illustrating X-ray diffraction analysis of the piezoelectric ceramic of an embodiment.

A Cu-Kα tube is used as the radiation source. By setting the scattering angle 2θ in the range of 20° to 50°, information of (002) and (200) planes can be obtained. The desired spot diameter of the incident beam depends on the area of the measurement surface, but is desirably such that the entire area of the measurement surface can be irradiated with the incident beam. Also, the scanning speed may be set in the range of 0.10 degree/min to 1.00 degree/min from the viewpoint of ensuring a satisfactory intensity, and the sampling intervals are set in the range of 0.001 degree to 0.020 degree from the viewpoint of obtaining high reproducibility of measurement results. FIG. 4 is a schematic representation illustrating X-ray diffraction analysis of the piezoelectric ceramic of the present embodiment, showing the relationship between θ and 2θ. If a multi-axis diffractometer is used, the angle ψ between the measurement surface 4 and the normal to incident beam is set to 0°.

The ratio of the lattice constant c of the c-axis of the piezoelectric ceramic of the present embodiment at room temperature to the lattice constant a of the a-axis thereof satisfy the relationship 1.004≤c/a≤1.010 (c>a). When the c/a ratio is in this range, the piezoelectric ceramic has a satisfactory electromechanical coupling factor $k_{31}$. Accordingly, the driving electric power of a piezoelectric element using the piezoelectric ceramic of the present embodiment can be reduced. On the other hand, if the c/a ratio is less than 1.004, the crystal structure of the piezoelectric element comes close to a cubic system, so that the electromechanical coupling factor $k_{31}$ decreases at room temperature. Consequently, the input voltage required to drive the piezoelectric element increases; hence the driving electric power increases undesirably. Also, if the c/a ratio is larger than 1.010, the voltage required for polarization increases undesirably.

The lattice constants a and c of the piezoelectric ceramic can be determined using the plane intervals obtained from diffraction peaks observed by the 2θ-θ method. The interval $d_{(200)}$ of (200) planes, the interval $d_{(002)}$ of (002) planes are expressed by the following equations, and also the lattice constants a and c are expressed by the following equations, wherein $θ_{200}$ and $θ_{002}$ represent the angles at which the diffraction peaks of the (200) plane and (002) plane are maximum, respectively. These crystal planes are represented by pseudo cubic notation.

$$d_{(200)} = \frac{\lambda}{2\sin\theta_{200}}$$

$$d_{(002)} = \frac{\lambda}{2\sin\theta_{002}}$$

$$a = 2 \cdot d_{(200)}$$

$$c = 2 \cdot d_{(002)}$$

From the viewpoint of obtaining a satisfactory electromechanical coupling factor $k_{31}$, it is advantageous that the piezoelectric ceramic has a tetragonal crystal structure at room temperature.

In the present embodiment, the diffraction peak of the (002) plane of the measurement surface of the piezoelectric ceramic may have a half-width of 1.2° or less at room temperature. Advantageously, it is 0.5° or less. The term half-width refers to the difference between the angles $θ_1$ and $θ_2$ ($θ_2>θ_1$) at which the peak intensity is half (P/2) of the maximum peak intensity P on the diffraction peak curve. Half-width may be referred to as full width at half maximum. For calculating the magnitude of maximum intensity, the diffraction intensity based on the background must be subtracted.

If the diffraction peak of the (002) plane has a half-width of 1.2° or less at room temperature, the piezoelectric ceramic has a satisfactory mechanical quality factor Qm. On the other hand, if the half-width of the diffraction peak of the (002) plane is larger than 1.2°, the ceramic cannot have crystallinity sufficient to exhibit good mechanical quality factor Qm.

The piezoelectric ceramic of the present embodiment may further contain Bi. The presence of Bi in the piezoelectric ceramic increases the relative density of the ceramic. The Bi content may be in the range of 0.04 parts by weight to 0.80 parts by weight relative to 100 parts by weight of the perovskite-type metal oxide.

If the Bi content is less than 0.04 parts by weight, the relative density of the piezoelectric ceramic is unlikely to increase in comparison with ceramic not containing Bi. On the other hand, if the Bi content is higher than 0.80 parts by weight, the electromechanical coupling factor $k_{31}$ decreases to increase the input voltage required to drive the piezoelectric ceramic. This can undesirably increase the driving electric power.

The perovskite-type metal oxide of the piezoelectric ceramic of the present embodiment may be expressed by the following general formula (1):

$$(Ba_{1-x}Ca_x)_q(Ti_{1-y}Zr_y)O_3 \quad (1)$$

In general formula (1), x represents a numeral satisfying $0.125 \leq x \leq 0.300$, y represents a numeral satisfying $0.041 \leq y \leq 0.074$, and q represents a numeral satisfying $0.986 \leq q \leq 1.020$.

When x, y and q are in those ranges, the piezoelectric ceramic exhibits a higher mechanical quality factor Qm and a satisfactory electromechanical coupling factor $k_{31}$ at room temperature.

General formula (1) of the perovskite-type metal oxide represents that Ba and Ca are present in the A site, while Ti and Zr are present in the B site. Part of Ba or Ca, however, may be present in the B site. Similarly, part of Ti or Zr may be present in the A site. In general formula (1), the mole ratio of the elements in the B site to the oxygen (O) element is 1 to 3. Even if this ratio is slightly varied, the metal oxide is within the scope of the application as long as the main phase of the metal oxide has the perovskite structure.

In the present embodiment, the molar fraction x of the Ca in the A site of the piezoelectric ceramic desirably satisfies $0.125 \leq x \leq 0.300$. If x is less than 0.125, the relative dielectric constant $\in r$ at room temperature can be increased to increase the capacitance electric power. In contrast, if x is larger than 0.300, the mechanical quality factor $Q_m$ decreases to increase the input voltage required to drive the piezoelectric ceramic. This can undesirably increase the driving electric power. More desirably, x satisfies $0.125 \leq x \leq 0.190$.

In the present embodiment, the molar fraction y of the Zr in the B site of the piezoelectric ceramic may satisfy $0.041 \leq y \leq 0.074$. If y is larger than 0.074, the relative dielectric constant $\in r$ at room temperature increases. This can undesirably increase the capacitance electric power. In contrast, if y is less than 0.041, the electromechanical coupling factor $k_{31}$ decreases to increase the input voltage required to drive the piezoelectric ceramic. This can undesirably increase the driving electric power. More desirably, y satisfies $0.050 \leq y \leq 0.074$.

In the piezoelectric ceramic of the present embodiment, the ratio q of the moles of Ba and Ca in the A site to the moles of Ti and Zr in the B site desirably satisfies $0.986 \leq q \leq 1.020$. If q is less than 0.986, the crystal grains of the piezoelectric ceramic can grow abnormally and result in reduced mechanical strength. In contrast, if q is larger than 1.020, the temperature required to grow crystal grains increases excessively. This can make it difficult to sinter the ceramic in an ordinary furnace. "Make it difficult to sinter" implies that the resulting ceramic has pores or defects therein or does not have a sufficient density. Desirably, q satisfies $0.998 \leq q \leq 1.016$. The ratio of the total moles A1 of Ba and Ca to the total moles B1 of Ti, Zr and Mn may satisfy $0.993 \leq A1/B1 \leq 0.998$. When the ratio A1/B1 is in this range, the piezoelectric ceramic of the present embodiment exhibits satisfactory electromechanical coupling factor $k_{31}$ and mechanical quality factor. This implies that the piezoelectric element can be driven with a low power consumption.

Desirably, the electromechanical coupling factor $k_{31}$ of the piezoelectric ceramic is 0.200 or more at room temperature.

When the electromechanical coupling factor $k_{31}$ is 0.200 or more at room temperature, the input power required to drive the piezoelectric element can be reduced to reduce the driving electric power. In contrast, if the electromechanical coupling factor $k_{31}$ is less than 0.200, the input voltage required to drive the piezoelectric ceramic can increase. This increases the driving electric power.

Desirably, the relative dielectric constant $\in r$ of the piezoelectric ceramic is 2500 or less at room temperature. If the relative dielectric constant exceeds 2500, the capacitance electric power of the piezoelectric element can increase.

In the present embodiment, the crystal grains of the piezoelectric ceramic may have an average equivalent circular diameter in the range of 0.5 μm to 10 μm. The term average equivalent circular diameter refers to the average of the equivalent circular diameters of a plurality of crystal grains. When the average equivalent circular diameter of the crystal grains is in this range, the piezoelectric ceramic can exhibit satisfactory mechanical quality factor and mechanical strength. If the average equivalent circular diameter is less than 0.5 μm, the piezoelectric properties of the piezoelectric ceramic can be poor. In contrast, if it is larger than 10 μm, the mechanical strength can decrease undesirably. Advantageously, the average equivalent circular diameter is in the range of 1.9 μm to 9.0 μm.

The term "equivalent circular diameter" used herein refers to "projected area-equivalent circular diameter", which is the diameter of a circle with an area equivalent to the projected area of a grain when measured through a microscope. In the present embodiment, the equivalent circular diameter may be measured by any method without particular limitation. For the measurement, for example, the surface of the piezoelectric ceramic may be photographed through a polarizing microscope or an electron microscope, and the image of the photograph is processed. An optical microscope and an electron microscope may be selectively used depending on the grain size.

In the present embodiment, the relative density of the piezoelectric ceramic may be in the range of 93% to 100%. The relative density is the ratio of the measured density of a piezoelectric ceramic to the theoretical density calculated using the lattice constant of the piezoelectric ceramic and the atomic weights of the elements in the ceramic. The lattice constant can be estimated by, for example, X-ray diffraction analysis. Density can be measured by, for example, Archimedian method.

A relative density of less than 93% can lead to an unsatisfactory electromechanical coupling factor $k_{31}$ or mechanical quality factor Qm, or a reduced mechanical strength. Desirably, the relative density of the piezoelectric ceramic is in the range of 95% to 100%, more desirably in the range of 97% to 100%.

A method for manufacturing the piezoelectric ceramic will now be described, but is not limited to the disclosed method. The method for manufacturing the piezoelectric ceramic includes the steps of forming a compact from raw materials, and sintering the compact.

The step of forming a compact from raw materials is not particularly limited. For example, the compact may be formed using solid powders of oxides, carbonates, nitrates, oxalates or the like containing the constituent elements. Then the compact may be sintered by a conventional method under normal pressure. The raw materials include metal compounds such as a Ba compound, a Ca compound, a Ti compound, a Zr compound, a Mn compound, and a Bi compound.

Ba compounds used as the raw material include barium oxide, barium carbonate, barium oxalate, barium acetate, barium nitrate, barium titanate, barium zirconate, and barium titanate zirconate.

Ca compounds used as the raw material include calcium oxide, calcium carbonate, calcium oxalate, calcium acetate, calcium titanate, and calcium zirconate.

Ti compounds used as the raw material include titanium oxide, barium titanate, barium titanate zirconate, and calcium titanate.

Zr compounds used as the raw material include zirconium oxide, barium zirconate, barium titanate zirconate, and calcium zirconate.

Mn compounds used as the raw material include manganese carbonate, manganese dioxide, manganese acetate, and trimanganese tetraoxide.

An exemplary Bi compound may be bismuth oxide.

The material added to control the ratio q of the moles of Ba and Ca in the A site to the moles of Ti and Zr in the B site is not particularly limited. Any compound of Ba compounds, Ca compounds, Ti compounds and Zr compounds can produce the same effect.

The compact is a solid material formed by compacting solid powders. For compacting the powders, uniaxial pressing, cold isostatic pressing, hot isostatic processing, casting, or extrusion may be applied. For forming the compact, granulated powder is advantageously used. When a compact of granulated powder is sintered, the sintered compact tends to have a uniform grain size.

Although the granulation of the raw material powders is not particularly limited, a spray dry process is advantageous for forming granulated powder having a uniform particle size.

A binder, such as polyvinyl alcohol (PVA), polyvinyl butyral (PVB), or acrylic resin, may be used for granulation. The binder may be added in a proportion of 1 part by weight to 10 parts by weight relative to 100 parts by weight of the raw material powders. From the viewpoint of increasing the density of the compact, the proportion of the binder may be in in the range of 2 parts by weight to 5 parts by weight.

The compact may be sintered in any process without particular limitation. For example, the compact may be sintered in an electric furnace or a gas furnace, or by being energized for heating, using microwaves or millimeter waves, hot isostatic press (HIP), or any other technique. Sintering in an electric furnace or a gas furnace may be performed in a continuous or batch furnace.

The sintering is desirably performed at, but not limited to, a temperature at which compounds react to sufficiently grow crystals. For example, the sintering temperature may be in the range of 1100° C. to 1400° C., such as 1100° C. to 1350° C., from the viewpoint of controlling the grain size in the range of 1.5 µm to 10 µm. In order to stabilize the properties of the sintered piezoelectric material with high repeatability, the sintering is performed at a constant temperature in the above range for 2 to 48 hours. In addition, it is advantageous to rapidly cool the compact when it is cooled from the maximum temperature. Rapid cooling helps internal stress remain in the piezoelectric ceramic. Consequently, a larger number of c-domains are observed at the measurement surface in the piezoelectric ceramic. Accordingly, the mechanical quality factor increases. The cooling rate may be 50° C./hour or more.

Piezoelectric Element

Figure 5:
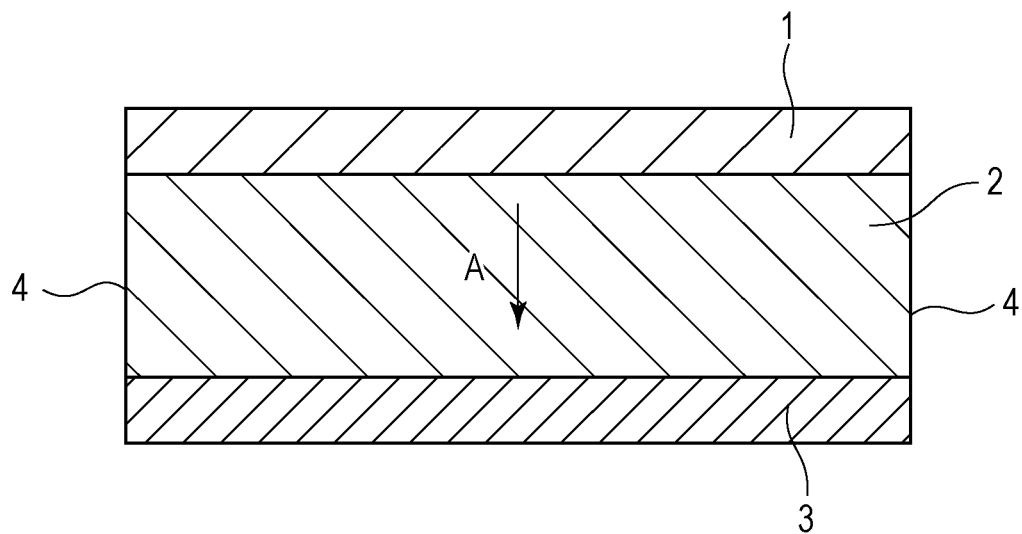
FIG. 5 is a sectional view of a piezoelectric element according to an embodiment of the present application.

A piezoelectric element according to an embodiment includes a first electrode 1, a piezoelectric material portion 2, and a second electrode 3. The piezoelectric material portion 2 is made of the piezoelectric ceramic of an embodiment of the present application. The first and the second electrode intersect the remanent polarization direction of the piezoelectric ceramic. FIG. 5, which is a sectional view of the piezoelectric element of the present embodiment, shows the structure of the piezoelectric element including a rectangular piezoelectric material portion 2 provided with a first and a second rectangular electrode 1 and 3. Arrow A indicates the remanent polarization direction. The first electrode 1 and the second electrode 3 are disposed on opposing surfaces of the piezoelectric material portion 2. The shape of the piezoelectric material portion 2 is not limited to rectangular parallelepiped, and may be in circular or polyhedral shape. The shape and arrangement of the first and second electrodes 1 and 3 are not also limited to those of the disclosed structure. For example, the first and the second electrode may be formed in a desired pattern as long as they are disposed on opposing surfaces.

When the first electrode 1 and the second electrode 3 intersect the remanent polarization direction of the piezoelectric ceramic, the piezoelectric element has a satisfactory electromechanical coupling factor $k_{31}$ and mechanical quality factor Qm in a direction perpendicular to the direction of voltage application. The first and second electrodes 1 and 3 are each defined by an electroconductive layer having a thickness of about 5 nm to 20 nm. Any material used for electrodes of known piezoelectric elements can be used without particular limitation. Exemplary electrode materials include metals, such as Ti, Pt, Ta, Ir, Sr, In, Sn, Au, Al, Fe, Cr, Ni, Pd, Ag, Cu, and compounds thereof. The first and second electrodes 1 and 3 may be made of one of these metals or may be a multilayer composite made of two or more of these metals. The first electrode 1 and the second electrode 3 may be made of different materials from each other. From the viewpoint of mass production and cost efficiency, it is advantageous that the electrodes be made of Ag. Ag electrodes may have a thickness of 1 µm to 10 µm.

The method for forming the first and second electrodes 1 and 3 is not particularly limited. For example, the first and second electrodes 1 and 3 may be formed by application and baking of a metal paste, or by sputtering or vapor deposition. For forming Ag electrodes, application and baking of an Ag paste is advantageous. More advantageously, an Ag paste is applied on the surfaces of the piezoelectric ceramic of the piezoelectric material portion 2, and the piezoelectric ceramic and the Ag paste are baked by being heated at one time at temperatures up to a maximum temperature of 700° C. to 900° C. for about 5 minutes. Still more advantageously, after being baked, the composite of the electrodes and the piezoelectric ceramic is cooled at a rate of 100° C./hour or more. By baking the Ag paste under such conditions, the Ag electrodes exhibit satisfactory, stable conductivity. In addition, this baking applies heat treatment to the dielectric ceramic of the piezoelectric material portion 2 to release residual stress. Consequently, the (002)/(200) diffraction intensity ratio of the surface intersecting the remanent polarization direction can be easily controlled to 1.0 or more. It is however not undesirable to heat-treat the piezoelectric ceramic at 1000° C. or more. Such heat treatment can vary the composition of the piezoelectric ceramic.

Polarization of the piezoelectric ceramic may be performed by any technique without particular limitation. For example, polarization may be performed in the air or in silicone oil. From the viewpoint of mass production, polarization in the air is advantageous. Advantageously, the polarization is performed by applying an electric field of 5 kV/cm to 14 kV/cm for about 10 minutes to 30 minutes at temperatures up to a maximum temperature of 90° C. to 150° C. Also, while the ceramic is being cooled from the maximum temperature, it is advantageous to keep applying the electric field. By keeping applying the electric field, the (002)/(200) diffraction intensity ratio of the surface intersecting the remanent polarization direction can be easily controlled to 1.0 or more. Desirably, the piezoelectric ceramic has been heat-treated at a temperature of 700° C. to 900° C. from the viewpoint of reducing the electric field applied for polarization. The piezoelectric ceramic subjected to such heat treatment can be easily polarized even at an electric field of 8 kV/cm or less. From the viewpoint of increasing the mechanical quality factor Qm, the cooling may be performed at a rate of 100° C./h or more.

Vibration Device

Figure 6:
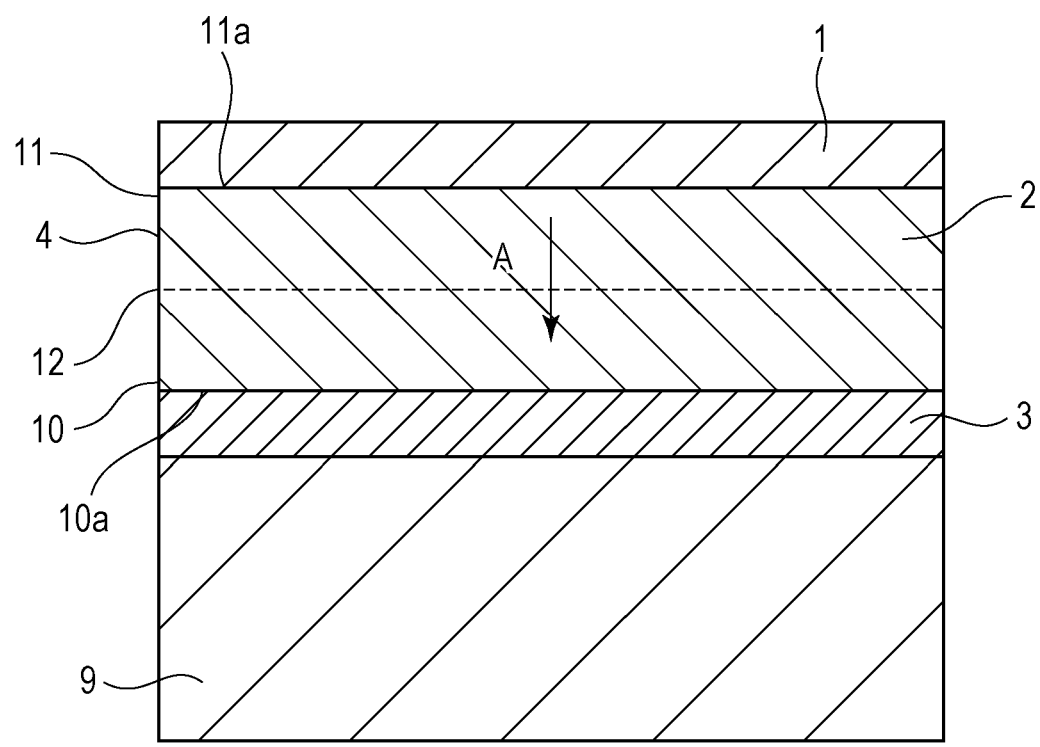
FIG. 6 is a schematic view of a vibration device according to an embodiment of the present application.

FIG. 6 is a schematic view of a vibration device according to an embodiment of the present application.

The vibration device includes the piezoelectric element and a diaphragm 9 on which the piezoelectric element is disposed. When the surface of the piezoelectric material portion 2 closer to the diaphragm 9 is the bottom surface thereof and the surface of the piezoelectric material portion 2 opposite the bottom surface is the front surface, the (002)/(200) diffraction intensity ratio A of the measurement surface 4 at the bottom surface (at a position 10) and the (002)/(200) diffraction intensity ratio B of the measurement surface 4 at the front surface (at a position 11) satisfy the relationship A>B at room temperature.

The diaphragm 9 is made of an elastic material. The elastic material may be, but is not limited to, stainless steel such as SUS or invar, Si, ceramic, glass, or quartz. The position 10 of the measurement surface at the bottom surface of the piezoelectric material portion 2 is an arbitrary point lying in the region of the measurement surface 4 from the bottom surface 10a of the piezoelectric material portion 2 (piezoelectric ceramic) to the midpoint 12 of the measurement surface 4. The position 11 of the measurement surface at the front surface of the piezoelectric material portion 2 is an arbitrary point lying in the region of the measurement surface 4 from the front surface 11a of the piezoelectric material portion 2 (piezoelectric ceramic) to the midpoint 12 of the measurement surface 4. The position 10 of the measurement surface 4 is desirably in the region of 50% in length from the bottom surface 10a relative to the length from the bottom surface 10a to the midpoint 12, more desirably in the region of 20% in length from the bottom surface. Similarly, the position 11 of the measurement surface 4 is desirably in the region of 50% in length from the front surface 11a relative to the length from the front surface 11a to the midpoint 12, more desirably in the region of 20% in length from the front surface 11a.

When the above-described diffraction intensity ratio A is larger than the diffraction intensity ratio B, the vibration device exhibits a satisfactory mechanical quality factor Qm. This is probably because the piezoelectric ceramic bonded to the diaphragm receives a tensile stress from the diaphragm. For measuring the (002)/(200) diffraction intensity ratio A of position 10 at the bottom surface of the piezoelectric material portion 2, the spot diameter of incident beam is set so that the measurement surface from the midpoint to the front surface is not irradiated with X-ray radiation. For measuring the (002)/(200) diffraction intensity ratio B of position 11 at the front surface of the piezoelectric material portion 2, the spot diameter of incident beam is set so that the measurement surface from the midpoint to the bottom surface is not irradiated with X-ray radiation. In the present embodiment, the spot diameter is desirably 100 µm or less. Since the measurement of diffraction intensity requires high accuracy, the same region is measured at least 10 times, and the average of the measurements is used for calculating the diffraction intensity ratio.

Desirably, the thermal expansion coefficient $\alpha_1$ at room temperature of the piezoelectric ceramic of the piezoelectric material portion 2 and the thermal expansion coefficient $\alpha_2$ of the diaphragm 9 at room temperature satisfy the relationship $\alpha_1 < \alpha_2$. When this relationship holds true, the piezoelectric ceramic receives a tensile stress from the diaphragm, so that c-domains tend to increase in number when observed from the measurement surface. Consequently, the mechanical quality factor Qm of the vibration device increases further. The increase in the mechanical quality factor Qm of the vibration device increases an efficiency of a device including the vibration device. This efficiency refers to the ratio of output power to input power. Hence, when input power is constant, the magnitude of power consumption is an indicator of the efficiency. In an ultrasonic motor that will be described later, the efficiency refers to the ratio of the product of torque and rotation speed to input power.

The thermal expansion coefficient of the piezoelectric ceramic used in the present embodiment is desirably $7 \times 10^{-6}$ $K^{-1}$ to $8 \times 10^{-6}$ $K^{-1}$ at room temperature. The thermal expansion coefficient of the diaphragm 9 is desirably higher than $8 \times 10^{-6}$ $K^{-1}$. Accordingly, for a stainless steel diaphragm, SUS, particularly SUS 420, is advantageously used as the material.

The vibration device may be produced by any process without particular limitation. A polarized piezoelectric element may be bonded to a diaphragm, or a piezoelectric element previously bonded to a diaphragm may be polarized. In view of productivity, it is advantageous to bond a polarized piezoelectric element to a diaphragm. The number of steps can be reduced.

Since the piezoelectric ceramic of the present embodiment mainly contains barium titanate, the piezoelectric property thereof can be lost by being heated at a temperature of 130° C. or more. Accordingly, an adhesive capable of adhering at 100° C. or less is desirably used for bonding the piezoelectric element.

Liquid Ejecting Head

A liquid ejecting head according to an embodiment will now be described.

A liquid ejecting head according to an embodiment of the application includes a liquid chamber including a vibration portion provided with the above-described piezoelectric element, and a portion defining an ejection opening communicating with the liquid chamber. A liquid ejecting head according to another embodiment includes a liquid chamber including a vibration portion provided with the above-described vibration device, and a portion defining an ejection opening communicating with the liquid chamber.

Figure 7A:
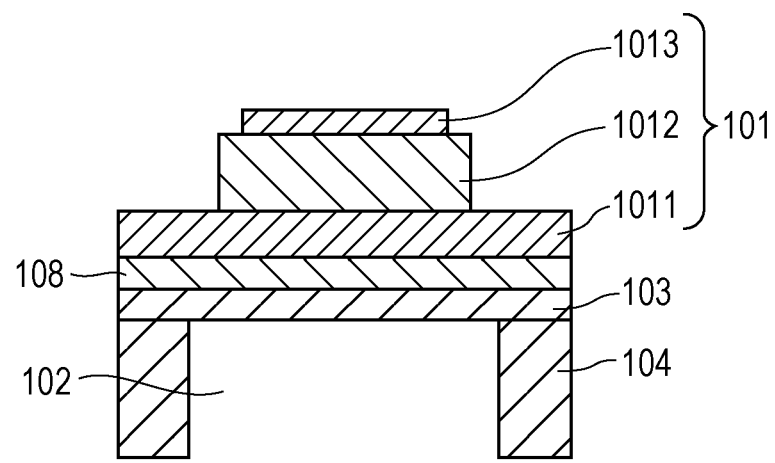
FIGS. 7A and 7B are schematic views of a liquid ejecting head according to an embodiment of the present application.
Figure 7B:
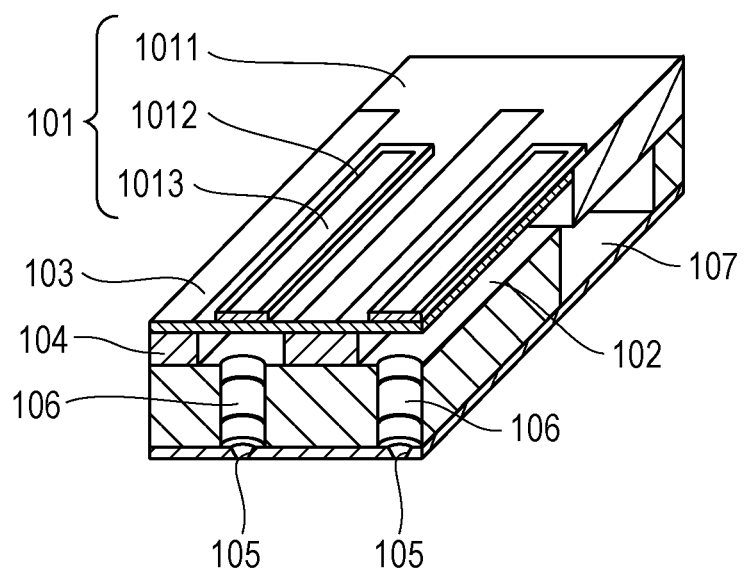

FIGS. 7A and 7B are schematic views of a liquid ejecting head according to an embodiment. As shown in FIGS. 7A and 7B, the liquid ejecting head includes piezoelectric elements 101. Each of the piezoelectric elements 101 includes a first electrode 1011, a piezoelectric ceramic portion 1012 made of a piezoelectric ceramic, and a second electrode 1013. The piezoelectric ceramic portion 1012 is formed in a pattern as needed, as shown in FIG. 7B.

FIG. 7B schematically shows the liquid ejecting head. The liquid ejecting head has ejection openings 105, discrete liquid chambers 102, communication holes 106 communicating between the discrete liquid chambers 102 and the corresponding ejection openings 105, liquid chamber partitions 104, a common liquid chamber 107, a diaphragm 103, and the piezoelectric elements 101. Although the shape of the piezoelectric element 101 shown in FIG. 7B is rectangular, the piezoelectric element 101 may have any shape, such as oval, circle or parallelogram. In general, the piezoelectric ceramic portion 1012 has a shape corresponding to the shape of the discrete liquid chamber 102.

The piezoelectric element 101 and vicinity thereof of the liquid ejecting head will now be described with reference to FIG. 7A. FIG. 7A is a sectional view of the piezoelectric element shown in FIG. 7B taken in the width direction thereof. Although the piezoelectric element 101 shown in FIG. 7A has a rectangular section, the section may be of trapezoid or inverted trapezoid.

In FIG. 7A, the first electrode 1011 is the lower electrode, and the second electrode 1013 is the upper electrode. However, the arrangement of the first and second electrodes 1011 and 1013 is not limited to that shown in the figure. For example, the first electrode 1011 may be used as the lower electrode or the upper electrode. Similarly, the second electrode 1013 may be used as the upper electrode or the lower electrode. A buffer layer 108 may be provided between the diaphragm 103 and the lower electrode. These components are named depending on the manufacturing process of the device. The piezoelectric element produces the same effect irrespective of what the components are called.

The diaphragm 103 is vertically displaced by the expansion and contraction of the piezoelectric ceramic portion 1012, thereby applying a pressure to a liquid in the corresponding discrete liquid chamber 102. Consequently, the liquid is ejected through the ejection opening 105. The liquid ejecting head of the present embodiment can be used in a printer or for manufacturing electronic devices.

The diaphragm 103 has a thickness in the range of 1.0 µm to 15 µm, such as in the range of 1.5 µm to 8 µm. The diaphragm 103 may be made of any material, and may be made of Si from the viewpoint of workability. The Si of the diaphragm 103 may be doped with boron or phosphorus. The buffer layer or electrode on the diaphragm 103 may act as a part of the diaphragm 103. The buffer layer 108 has a thickness in the range of 5 nm to 300 nm, such as in the range of 10 nm to 200 nm. The ejection opening 105 has an equivalent circle diameter in the range of 5 µm to 40 µm. The shape of the ejection opening 105 may be circular, star-like or triangular.

Liquid Ejecting Apparatus

A liquid ejecting apparatus according to an embodiment will now be described. A liquid ejecting apparatus according to an embodiment of the present application includes a portion on which a transfer medium is placed, and the above-described liquid ejecting head.

Figure 8:
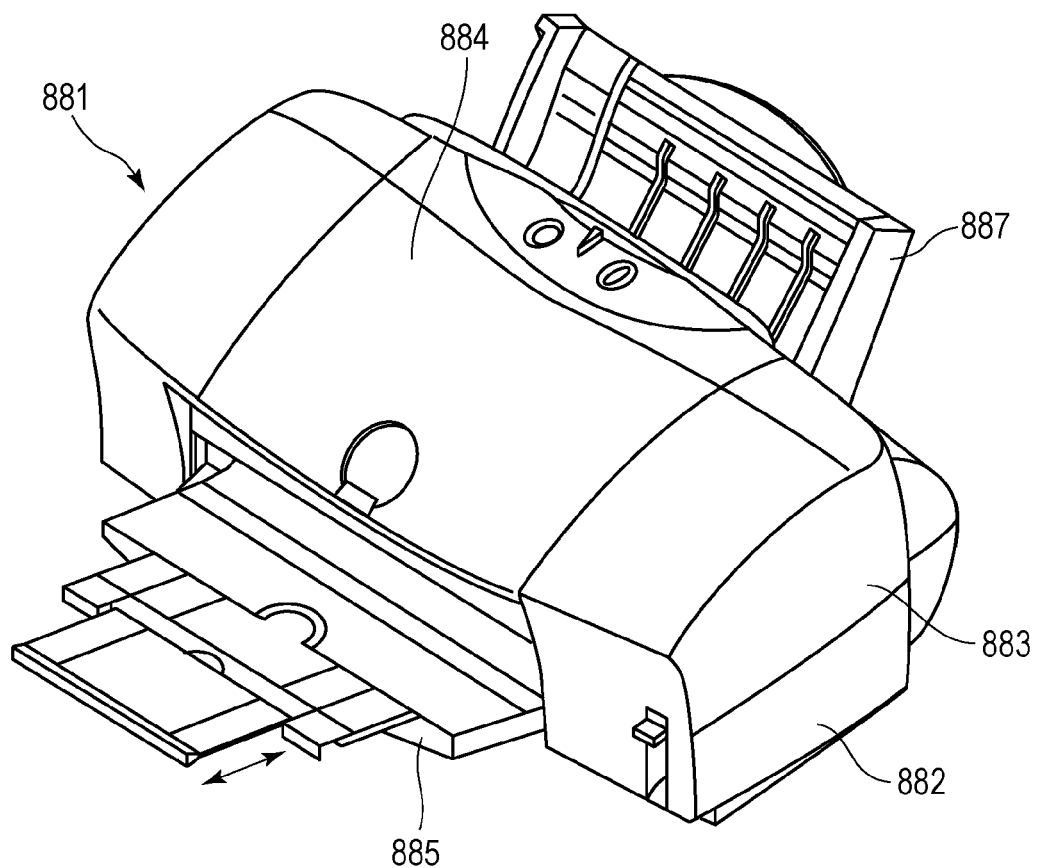
FIG. 8 is a schematic view of a liquid ejecting apparatus according to an embodiment of the present application.
Figure 9:
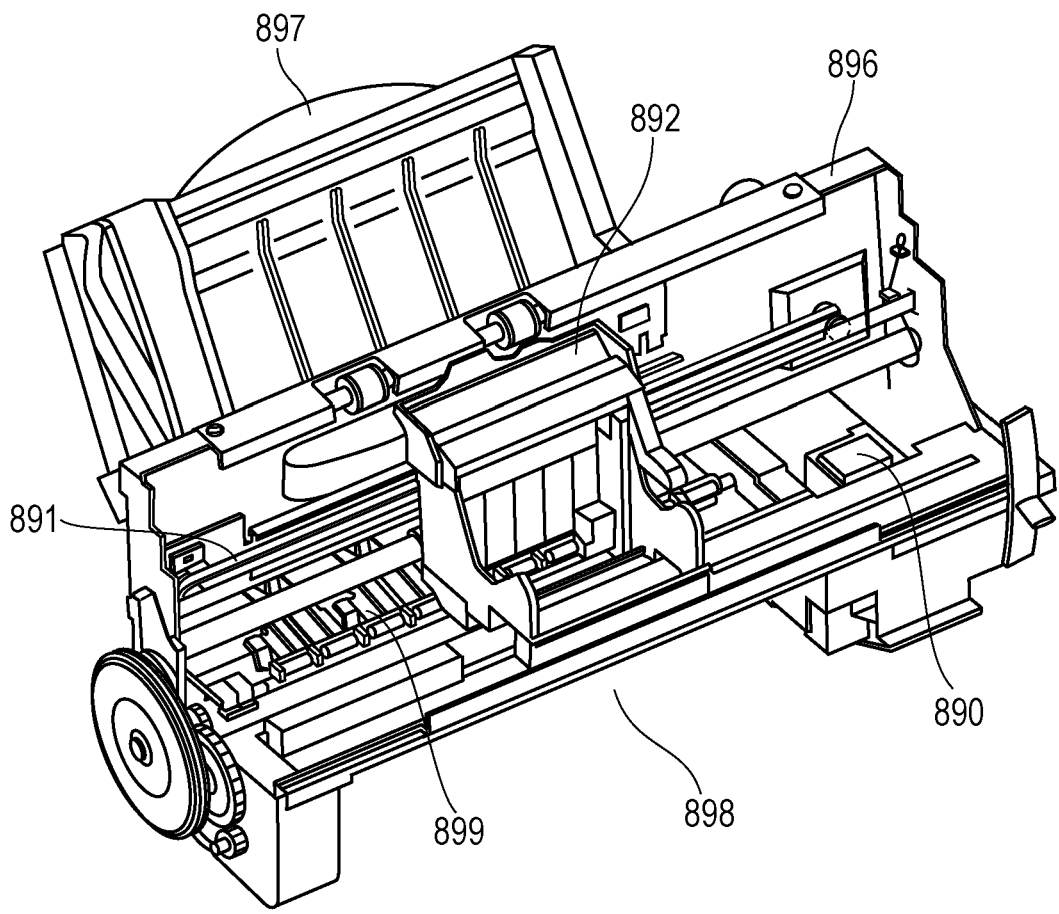
FIG. 9 is a schematic view of a liquid ejecting apparatus according to an embodiment of the present application.

The liquid ejecting apparatus may be an ink jet recording apparatus as shown in FIGS. 8 and 9. FIG. 9 shows the liquid ejecting apparatus (ink jet recording apparatus) 881 shown in FIG. 8 in a state where the external members 882 to 885 and 887 are removed therefrom. The ink jet recording apparatus 881 includes an automatic feeding section 897 that feeds recording paper, which is a transfer medium, into the body 896 thereof. The ink jet recording apparatus 881 further includes three sections that guide the recording paper fed from the automatic feeding section 897 to a predetermined recording position and then to an ejection port 898 from the recording position. More specifically, the ink jet recording apparatus has the following three sections: a conveying section 899 on which the transfer medium is placed; a recording section 891 where recording is performed on the recording paper conveyed to the recording position; and a recovering section 890 that recovers the recording section 891. The recording section 891 contains a liquid ejecting head of an embodiment of the application, and is provided therein with a carriage 892 that reciprocally moves on a rail.

In this ink jet recording apparatus, the carriage 892 is moved on the rail according to electrical signals transmitted from a computer, and the piezoelectric ceramic portion is displaced by applying a driving voltage to the electrodes between which the piezoelectric ceramic portion is disposed. The displacement of the piezoelectric ceramic portion applies a pressure to the discrete liquid chamber 102 via the diaphragm 103 shown in FIG. 7B, thereby ejecting the ink through the ejection opening 105 for printing.

The liquid ejecting apparatus of the present embodiment can evenly eject liquid at high speed and can be downsized.

Although the present embodiment illustrates a printer, the liquid ejecting apparatus may be used as a facsimile or multifunctional machine, a copy machine or any other ink jet recording apparatus, or an industrial liquid ejecting apparatus.

Also, the user can select a transfer medium suitable for use. The liquid ejecting apparatus may have the structure in which the liquid ejecting head moves relative to a transfer medium on a stage.

Ultrasonic Motor

An ultrasonic motor of an embodiment of the present application will now be described. An ultrasonic motor according to an embodiment includes a vibration device, and a moving device in contact with the vibration device. Desirably, the vibration device is that of an embodiment of the present application.

Figure 10:
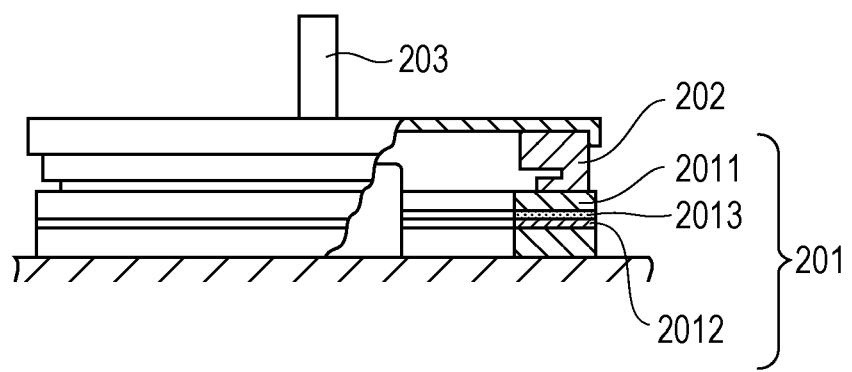
FIG. 10 is a schematic view of an ultrasonic motor according to an embodiment of the present application.

FIG. 10 is a schematic view of an ultrasonic motor according to an embodiment of the present application. The ultrasonic motor includes a piezoelectric element including a single-layer piezoelectric material portion made of a piezoelectric ceramic. The ultrasonic motor includes an oscillator 201, a rotor 202 in contact with a sliding surface of the oscillator 201 with a pressure applied by a pressure spring (not shown), and an output shaft 203 integrated with the rotor 202. The oscillator 201 includes a metal elastic ring 2011, a piezoelectric element 2012 according to an embodiment of the present application, and an organic adhesive 2013 (for example, epoxy or cyanoacrylate adhesive) bonding the piezoelectric element 2012 to the elastic ring 2011. The piezoelectric element 2012 includes a first and a second electrode (not shown) and a piezoelectric material portion made of a piezoelectric ceramic between the first and second electrodes. In FIG. 10, the oscillator 201 acts as the vibration device, and the rotor 202 acts as the moving device.

When a two-phase alternating voltage having phases different by an odd multiple of π/2 is applied to the piezoelectric element, the oscillator 201 generates flexural traveling waves, and each point on the sliding surface of the oscillator 201 moves elliptically. If the rotor 202 is in contact with the sliding surface of the oscillator 201 with pressure applied, the rotor 202 is rotated in the direction opposite to the direction of the flexural traveling waves by receiving a frictional force from the oscillator 201. A driven body (not shown) joined to the output shaft 203 is driven by the rotation of the rotor 202.

When a voltage is applied to the piezoelectric ceramic of the piezoelectric material portion, the piezoelectric ceramic is expanded and contracted by the piezoelectric effect. If the piezoelectric material portion is in contact with a metal or any other elastic material, the elastic material is bent by the expansion and contraction of the piezoelectric ceramic. The ultrasonic motor of the present embodiment is based on this principle.

The ultrasonic motor of the present embodiment, which includes the above-described vibration device, can operate more efficiently.

Optical Apparatus

An optical apparatus according to an embodiment will now be described. The optical apparatus includes a driving portion provided with the above-described ultrasonic motor.

Figure 11A:
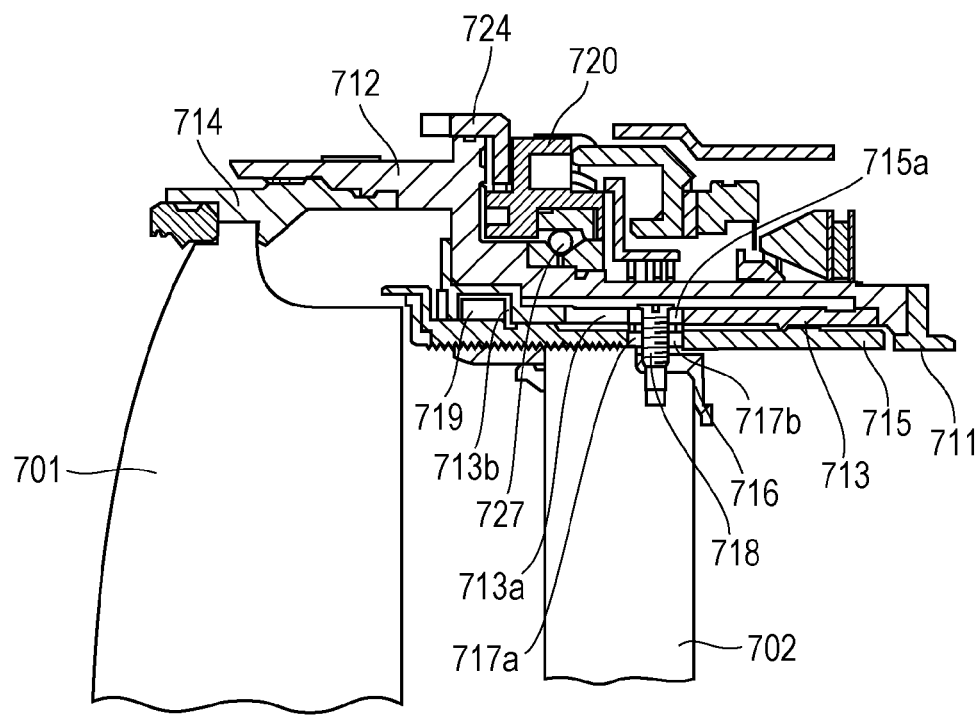
FIGS. 11A and 11B are schematic views of an optical apparatus according to an embodiment of the present application.
Figure 11B:
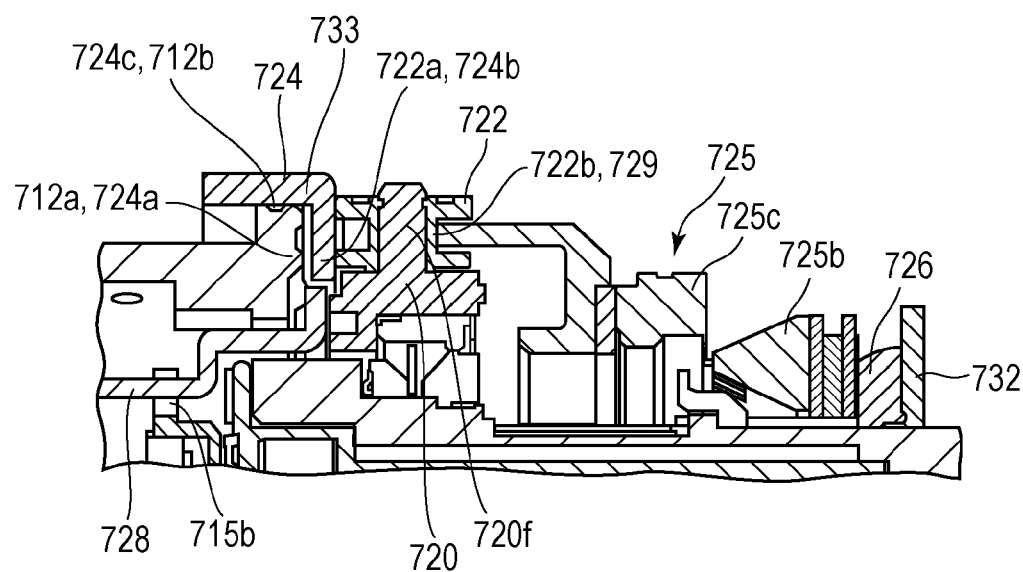
Figure 12:
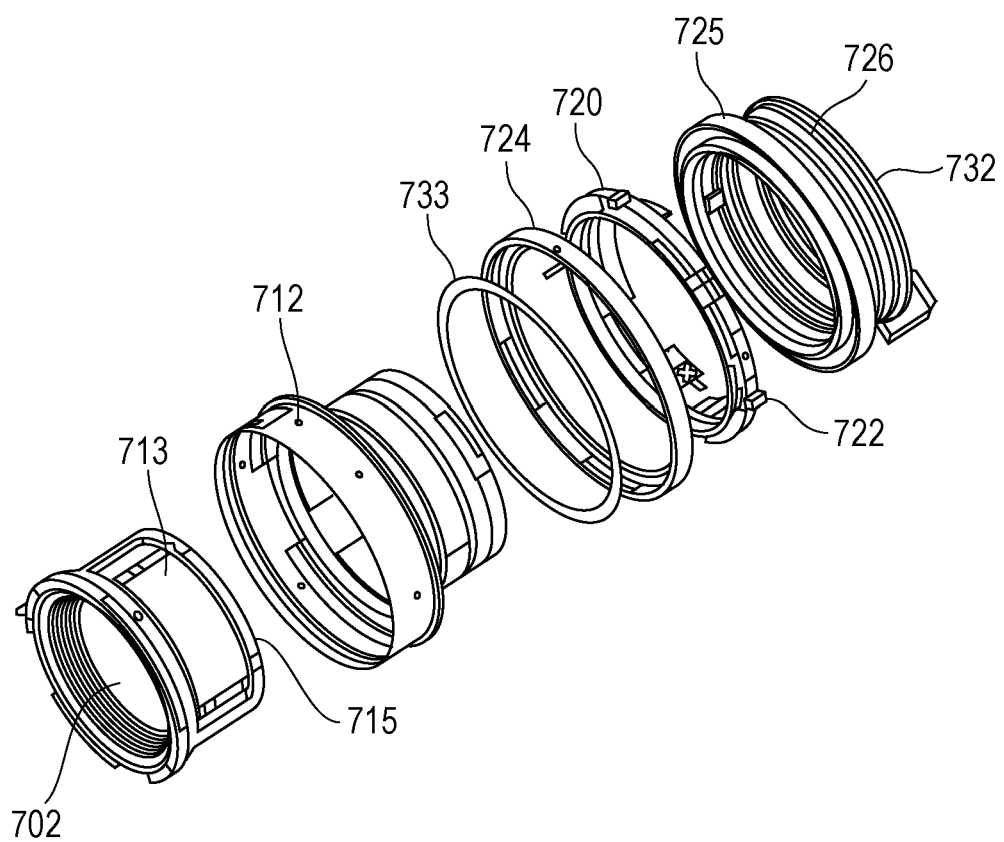
FIG. 12 is a schematic view of an optical apparatus according to an embodiment of the present application.

FIGS. 11A and 11B show sectional views of the main portion of an interchangeable lens barrel of a single-lens reflex camera as an exemplary optical apparatus. FIG. 12 shows an exploded perspective view of the interchangeable lens barrel of the single-lens reflex camera as an exemplary optical apparatus. A fixing barrel 712, a linear guide barrel 713 and a front group lens barrel 714 are fixed to a mount 711 at which the lens barrel is attached to or removed from the camera. These are fixing members for the interchangeable lens barrel.

The linear guide barrel 713 has a linear guide groove 713a for linearly guiding a focus lens 702 in an optical axis direction. Cam rollers 717a and 717b projecting radially outward are secured with an axis screw 718 to a rear group lens barrel 716 holding the focus lens 702. The com roller 717a is fitted in the linear guide groove 713a.

A cam ring 715 is rotatably fitted on the inner periphery of the linear guide barrel 713. The relative movement of the linear guide barrel 713 and the cam ring 715 in the optical axis direction is restricted by fitting a roller 719 fixed to the cam ring 715 in a peripheral groove 713b of the linear guide barrel 713. The cam ring 715 is provided with a cam groove 715a therein for the focus lens 702. The cam roller 717b is also fitted in the cam groove 715a.

A rotation transmitting ring 720 is disposed at the outer periphery of the fixing barrel 712. The rotation transmitting ring 720 is held with a ball race 727 for rotation at a fixed position relative to the fixing barrel 712. The rotation transmitting ring 720 rotatably holds rollers 722 on axes 720f radially extending from the rotation transmitting ring 720. The portion 722a of each roller 722 having the larger diameter is in contact with the end 724b, in the direction of the mount, of a manual focusing ring 724 (hereinafter this end 724b is referred to as mount-side end). The portion 722b of the roller 22 having the smaller diameter is in contact with a binding member 729. Six rollers 722 are arranged at regular intervals on the outer periphery of the rotation transmitting ring 720, each in the same manner as described above.

A low friction sheet (washer member) 733 is disposed on the inner diameter portion of the manual focusing ring 724. The low friction sheet is pinched between the mount-side end 712a of the fixing barrel 712 and the front end 724a of the manual focusing ring 724. The outer diameter surface of the low friction sheet 733 is in a shape of ring and is fitted on the inner surface 724c defining the inner diameter of the manual focusing ring 724. Also, the inner surface 724c of the manual focusing ring 724 is fitted on the outer diameter portion 712b of the fixing barrel 712. The low friction sheet 733 serves to reduce the friction of the rotation ring mechanism for rotating the manual focusing ring 724 on the optical axis relative to the fixing barrel 712.

The larger diameter portion 722a of the roller 722 and the mount-side end 724b of the manual focusing ring 724 are in contact with each other with a pressure applied by the force of a wave washer 726 pressing an ultrasonic motor 725 in a forward direction of the lens. Similarly, the smaller diameter portion 722b of the roller 722 and the binding member 729 are in contact with each other with an appropriate pressure applied by the force of the wave washer 726 pressing the ultrasonic motor 725 in a forward direction of the lens. The movement of the wave washer 726 toward the mount is restricted by a washer 732 bayonet-coupled to the fixing barrel 712. The spring force (urging force) generated by the wave washer 726 is transmitted to the ultrasonic motor 725 and further to the roller 722, and presses the manual focusing ring 724 on the mount-side end 712a of the fixing barrel 712. Hence, the manual focusing ring 724 is incorporated in a state where it is pressed on the mount-side end 712a of the fixing barrel 712 with the low friction sheet 733 therebetween.

When the ultrasonic motor 725 is driven for rotation relative to the fixing barrel 712 by a controller (not shown), the roller 722 is rotated on the axis 720f because of the frictional contact between the binding member 729 and the smaller diameter portion 722b of the roller 722. The rotation of the roller 722 on the axis 720f causes the rotation transmitting ring 720 to rotate on the optical axis (autofocusing operation).

If a force for rotation on the optical axis is applied to the manual focusing ring 724 from a manual operation input portion (not shown), the following operation occurs. Since the mount-side end 724b of the manual focusing ring 724 is in pressure contact with the larger diameter portion 722a of the roller 722, the roller 722 is rotated on the axis 720f by friction. The rotation of the larger diameter portion 722a of the roller 722 on the axis 720f causes the rotation transmitting ring 720 to rotate on the optical axis. At this time, the friction retaining force of the rotor 725c and the stator 725b prevents the ultrasonic motor 725 from rotating (manual focusing operation).

Two focus keys 728 are attached to the rotation transmitting ring 720 so as to oppose each other, and are fitted in a notch 715b formed in an end of a cam ring 715. Thus the rotation of the rotation transmitting ring 720 on the optical axis by autofocusing operation or manual focusing operation is transmitted to the cam ring 715 with the focus keys 728 therebetween. When the cam ring is rotated on the optical axis, the rear group lens barrel 716 whose rotation is restricted by the cam roller 717a and the linear guide groove 713a is reciprocally moved along the cam groove 715a in the cam ring 715 by the cam roller 717b. Thus, the focus lens 702 is driven for focusing.

Although the present embodiment has illustrated an interchangeable lens barrel of a single-lens reflex camera as an optical apparatus, the optical apparatus may be a compact camera, an electronic still camera, and any other camera including an ultrasonic motor in the driving section.

Vibration Unit and Dust Removing Unit

Vibration units for delivering and removing particles, powder, or liquid are widely used in electronic apparatuses. A dust removing unit including the piezoelectric element according to an embodiment of the present application will now be described as an exemplary vibration unit.

A vibration unit according to an embodiment of the present application includes a vibration device including the above-described piezoelectric element and a diaphragm on which the piezoelectric element is disposed, and functions to remove dust on the surface of the diaphragm. Desirably, the vibration device is that of an embodiment of the present application. A dust removing unit according to an embodiment of the present application includes a vibrating portion provided with the above-described vibration unit.

Figure 13A:
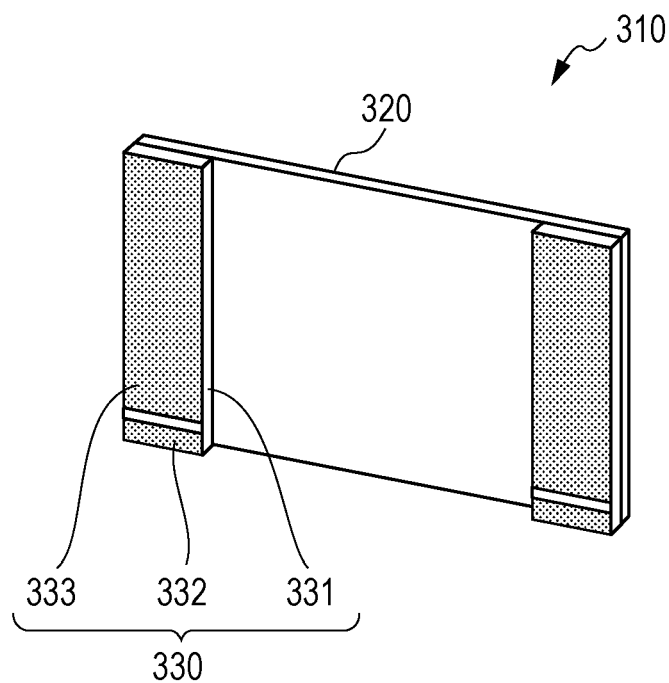
FIGS. 13A and 13B are a vibration unit according to an embodiment of the present application, used as a dust removing unit.
Figure 13B:
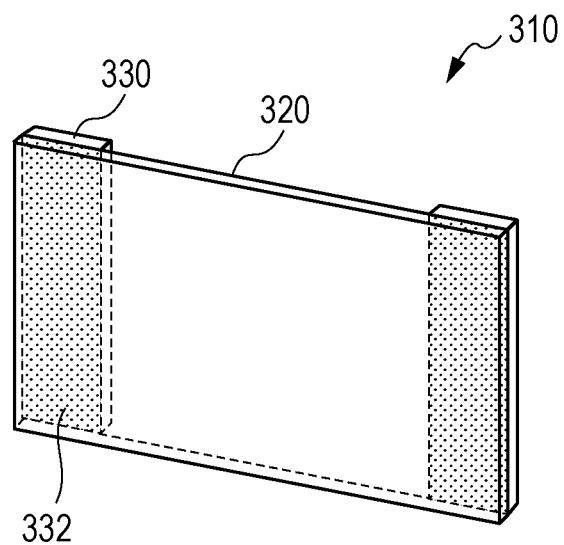

FIGS. 13A and 13B are schematic views of a dust removing unit according to an embodiment of the present application. The dust removing unit 310 includes plate-like piezoelectric elements 330 and a diaphragm 320. The diaphragm 320 may be made of any material without particular limitation. For example, if the dust removing unit 310 is used for optical devices, an optically transparent material or an optically reflective material is used in the diaphragm 320, and dust is removed from the portion of the optically transparent material or optically reflective material.

Figure 14A:
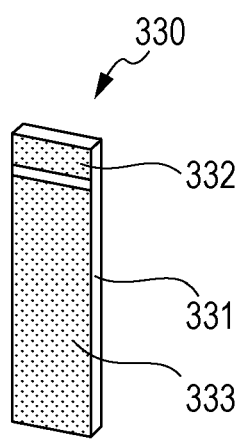
FIGS. 14A to 14C are schematic views of the piezoelectric element used in a dust removing unit.
Figure 14B:
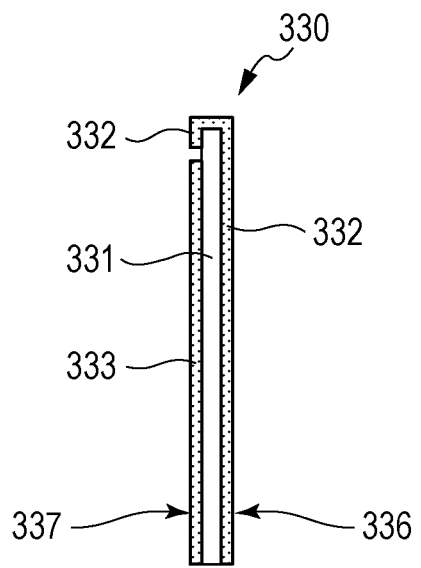
Figure 14C:
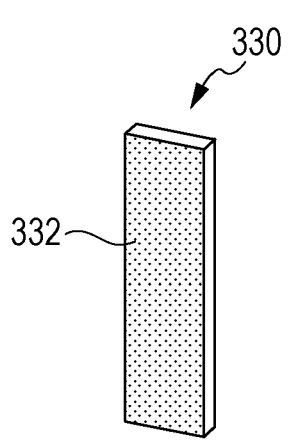

FIGS. 14A to 14C are schematic views of the piezoelectric element 330 shown in FIGS. 13A and 13B. FIGS. 14A and 14C show the front and the rear of the piezoelectric element 330, and FIG. 14B shows a side of the piezoelectric element 330. As shown in FIGS. 13A and 13B, the piezoelectric element 330 includes a piezoelectric material portion 331 made of a piezoelectric ceramic, a first electrode 332 and a second electrode 333. The first electrode 332 and the second electrode 333 oppose the plate surface of the piezoelectric material portion 331. The surface of the piezoelectric element 330 provided with the first electrode 332 viewed in FIG. 14C is referred to as a first electrode surface 336. The surface of the piezoelectric element 330 provided with the second electrode 333 viewed in FIG. 14A is referred to as a second electrode surface 337.

The electrode surfaces are each the surface of the piezoelectric element provided with an electrode. For example, as shown in FIGS. 14A to 14C, the first electrode 332 may round and extend to the second electrode surface.

The piezoelectric elements 330 are fixed to the diaphragm 320 in such a manner that the first electrode surfaces 336 of the piezoelectric elements 330 are bonded to a plate surface of the diaphragm 320, as shown in FIGS. 13A and 13B. When the piezoelectric element 330 operates, a stress occurs between the piezoelectric element 330 and the diaphragm 320, and the diaphragm 320 generates out-of-plane vibration. In the dust removing unit 310 of the present embodiment, dust on the surface of the diaphragm 320 is removed by the out-of-plane vibration of the diaphragm 320. The term out-of-plane vibration refers to an elastic vibration that displaces the diaphragm in the direction of the optical axis, that is, in the thickness direction of the diaphragm.

Figures 15A, 15B:
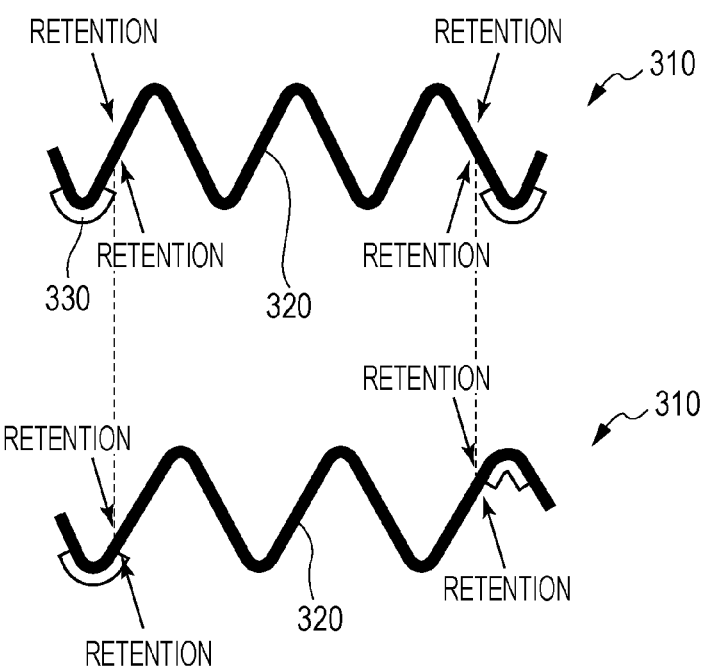
FIGS. 15A and 15B are schematic representations illustrating the principle of the vibration of the dust removing unit.

FIGS. 15A and 15B are schematic representations illustrating the principle of the vibration of the dust removing unit 310. FIG. 15A shows a state where out-of-plane vibration is generated in the diaphragm 320 by applying an in-phase alternating electric field to a pair of piezoelectric elements 330 opposing in a side-to-side direction. The piezoelectric ceramic of each piezoelectric element 330 is polarized in the same direction as the thickness direction of the piezoelectric element 330, and the dust removing unit 310 is operated in a seventh-order vibration mode. FIG. 15B shows a state where out-of-plane vibration is generated in the diaphragm 320 by applying a reverse phase alternating electric field with a phase difference of 180° to the pair of piezoelectric elements 330. In this instance, the dust removing unit 310 operates in a sixth-order vibration mode. By operating the dust removing unit 310 in at least two vibration modes depending on cases, dust on the surface of the diaphragm can be removed effectively.

Image Sensing Apparatus

Figure 16:
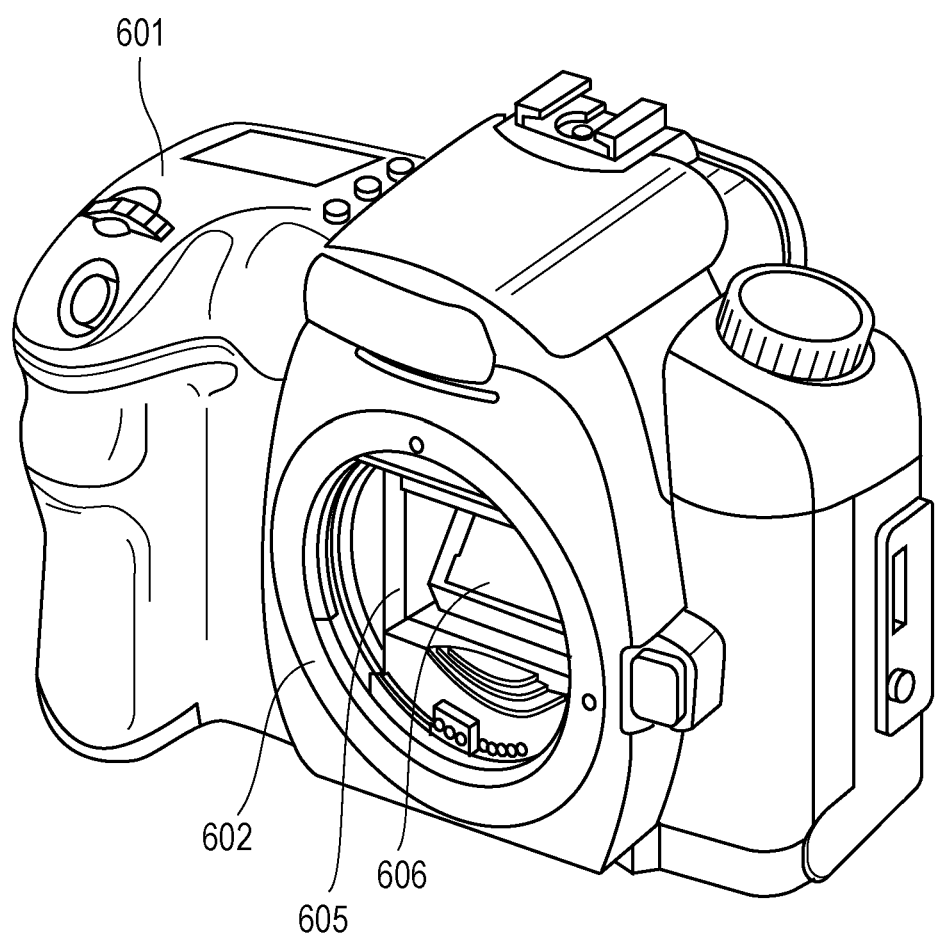
FIG. 16 is a schematic view of an image sensing apparatus according to an embodiment of the present application.
Figure 17:
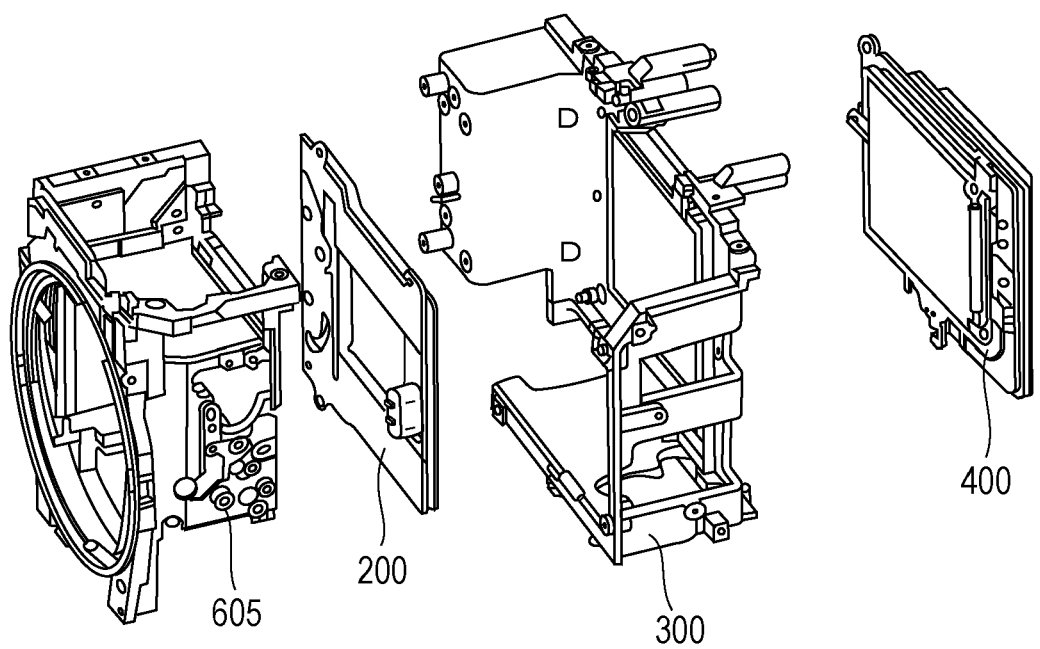
FIG. 17 is a schematic view of an image sensing apparatus according to an embodiment of the present application.

An image sensing apparatus according to an embodiment will now be described. The image sensing apparatus includes an image sensing element unit having a light receiving face, and the above-described dust removing unit on the light receiving face of the image sensing element unit. FIGS. 16 and 17 show a digital single-lens reflex camera as an exemplary image sensing apparatus according to an embodiment of the present application.

FIG. 16 is a front perspective view of the body 601 of the camera viewed from the object, showing a state where the photographing lens unit is removed. FIG. 17 is an exploded perspective view of the general structure of the camera, for illustrating the structure around the dust removing unit and the image sensing apparatus 400.

The camera body 601 shown in FIG. 16 is provided therein with a mirror box 605 to which a photographing light beam having passed through the photographing lens is guided. The mirror box 605 contains a main mirror (quick return mirror) 606. The main mirror 606 can take a position kept at an angle of 45° with respect to the photographing optical axis so as to conduct the photographing light beam to a penta roof mirror (not shown), and a position retracted from the photographing light beam so as to conduct the light beam to an image sensing element (not shown).

In the embodiment shown in FIG. 17, the camera body includes a chassis 300 acting as the frame of the camera body, and the chassis is provided with the mirror box 605 and a shutter unit 200 in that order from the direction of the object toward the chassis 300. Also, an image sensing unit 400 is disposed at the photographer side of the chassis 300. The image sensing unit 400 includes the diaphragm of a dust removing unit and an image sensing element unit. The diaphragm of the dust removing unit is coaxially aligned with the light receiving face of the image sensing element unit. The image sensing unit 400 is to be set on the mounting face of the mounting portion 602 (FIG. 16) with respect to which the photographing lens unit is mounted, and is adjusted so that the image sensing face of the image sensing element unit becomes parallel to the photographing lens unit with a predetermined distance therebetween.

A digital single-lens reflex camera has been described as the image sensing apparatus of an embodiment of the present application, the image sensing apparatus may be a photographing lens-interchangeable camera such as a mirrorless digital single-lens reflex camera not including a mirror box 605. The image sensing apparatus of the present embodiment may be applied to image sensing apparatuses such as photographing lens unit-interchangeable video cameras, copy machines, facsimiles, and scanners, and electronic apparatuses including such an image sensing apparatus and required to remove dust from the surface of the optical component.

Electronic Apparatus

An electronic apparatus according to an embodiment will now be described. An electronic apparatus of the present embodiment includes a piezoelectric acoustic component including the above-described piezoelectric element. Examples of the piezoelectric acoustic component include a loud-speaker, a beeper, a microphone, and a surface acoustic wave (SAW) element.

Figure 18:
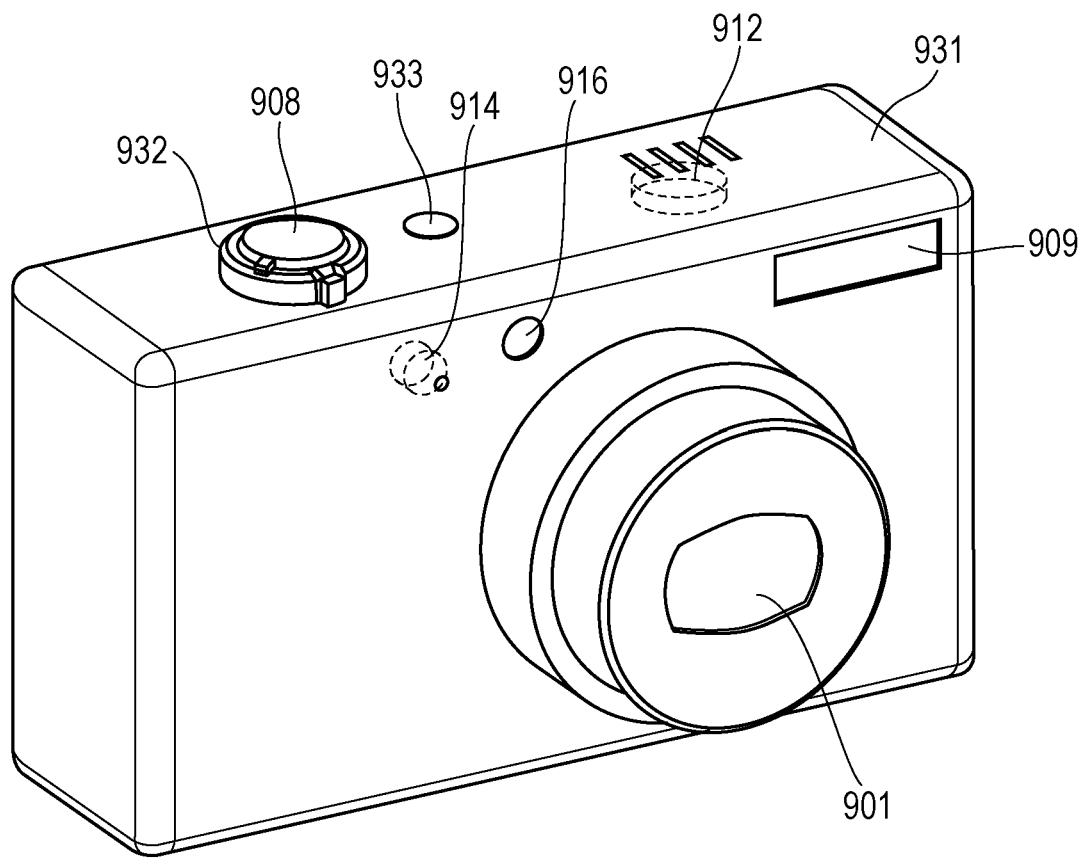
FIG. 18 is a schematic view of an electronic apparatus according to an embodiment of the present application.

FIG. 18 shows a perspective view of a digital camera as an exemplary electronic apparatus, viewed from in front of the body 931. The body 931 is provided with an optical device 901, a microphone 914, an electronic flash emitting portion 909 and an auxiliary light portion 916 at the front face thereof. The microphone 914 is embedded in the body, being indicated by a dashed line. The microphone 914 has a hole in front thereof for picking up sounds from the outside.

The body 931 is also provided with a power button 933, a loudspeaker 912, a zoom lever 932, and a release button 908 for focusing operation on the upper face thereof. The loudspeaker 912 is embedded in the body 931, being indicated by a dashed line. A hole is formed in front of the loudspeaker 912 and through which sounds are transmitted to the outside.

The piezoelectric acoustic component of an embodiment is used in at least one of a microphone 914, a loudspeaker 912, or a surface acoustic wave element.

Although a digital camera has been described as an exemplary embodiment of the electronic apparatus of the present application, the electronic apparatus may be any electronic apparatus including a piezoelectric acoustic component, such as a sound reproduction apparatus, a sound recorder, a cellular phone, or an information terminal.

As described above, the piezoelectric element according to an embodiment of the present application is suitable for liquid ejecting heads, liquid ejecting apparatuses, ultrasonic motors, optical apparatuses, vibration units, dust removing units, image sensing apparatuses, and electronic apparatuses.

The use of the piezoelectric element and vibration device according to an embodiment of the present application can provide a liquid ejecting head that can exhibit a power consumption lower than or equal to that of liquid ejecting heads including a lead-containing piezoelectric element, and an efficiency, a nozzle density and an ejection speed, each higher than or equal to those of liquid ejecting heads including a lead-containing piezoelectric element.

Also, the use of the liquid ejecting head according to an embodiment of the present application can provide a liquid ejecting apparatus that can exhibit a power consumption lower than or equal to that of liquid ejecting apparatuses including a lead-containing piezoelectric element, and an efficiency, a nozzle density and an ejection speed, each higher than or equal to those of liquid ejecting apparatuses including a lead-containing piezoelectric element.

The use of the piezoelectric element and vibration device according to an embodiment of the present application can provide an ultrasonic motor that can exhibit a power consumption lower than or equal to that in the case of using a lead-containing piezoelectric element, and an efficiency, a driving force and a durability, each higher than or equal to those in the case of using a lead-containing piezoelectric element.

Also, the use of the ultrasonic motor according to an embodiment of the present application can provide an optical apparatus that can exhibit a power consumption lower than or equal to that in the case of using a lead-containing piezoelectric element, and an efficiency, a durability and operation accuracy, each higher than or equal to those in the case of using a lead-containing piezoelectric element.

The use of the piezoelectric element and vibration device according to an embodiment of the present application can provide an ultrasonic motor that can exhibit a power consumption lower than or equal to that in the case of using a lead-containing piezoelectric element, and an efficiency, a vibrating ability and a durability, each higher than or equal to those in the case of using a lead-containing piezoelectric element.

The use of the vibration unit according to an embodiment of the present application provides a dust removing unit that can exhibit a power consumption lower than or equal to that in the case of using a lead-containing piezoelectric element, and an efficiency, a dust-removing ability and a durability, each higher than or equal to those in the case of using a lead-containing piezoelectric element.

The use of the dust removing unit according to an embodiment of the present application provides an image sensing apparatus that can exhibit a power consumption lower than or equal to that in the case of using a lead-containing piezoelectric element, and an efficiency and a dust-removing ability, each higher than or equal to those in the case of using a lead-containing piezoelectric element.

Also, the use of a piezoelectric acoustic component including a piezoelectric element of an embodiment of the present application can provide an electronic apparatus that can exhibit a power consumption lower than or equal to that in the case of using a lead-containing piezoelectric element, and an efficiency and a sound generation, each higher than or equal to those in the case of using a lead-containing piezoelectric element.

The piezoelectric element and vibration device of an embodiment of the present application can be used in devices as described above, and, in addition, in piezoelectric actuators such as ultrasonic oscillators.

EXAMPLES

The piezoelectric ceramic of the disclosed embodiment will be further described with reference to the following Examples. However, the invention is not limited to the Examples.

Preparation and Evaluation of Piezoelectric Ceramic

Example 1

$$(Ba_{1-x}Ca_x)_q(Ti_{1-y}Zr_y)O_3 \qquad (1)$$

In the formula, x represents a numeral satisfying $0.125 \leq x \leq 0.300$, y represents a numeral satisfying $0.041 \leq y \leq 0.074$, and q represents a numeral satisfying $0.986 \leq q \leq 1.020$.

Raw material powders for the composition $(Ba_{0.84}Ca_{0.16})_{1.006}(Ti_{0.94}Zr_{0.06})O_3$, which is a composition of general formula (1) $(Ba_{1-x}Ca_x)_q(Ti_{1-y}Zr_y)O_3$ in which x=0.16, y=0.06 and q=1.006, were weighed out as below.

A perovskite-type metal oxide powder containing barium titanate, having a particle size of 300 nm produced by a solid phase process, and calcium titanate powder, calcium zirconate powder and barium carbonate powder were weighed so as to satisfy the molar fractions of the above chemical formula.

Relative to 100 parts by weight of the metal oxide expressed by $(Ba_{0.84}Ca_{0.16})_{1.006}(Ti_{0.94}Zr_{0.06})O_3$, trimanganese tetraoxide was weight in a proportion of 0.24 parts by weight in terms of Mn. All the powders weighed out were mixed in a dry manner in a ball mill for 24 hours. A PVA binder in a proportion of 3 parts by weight to the total weight of the mixture of the powders was applied to the surfaces of the powder for granulation, using a spray dryer.

The granulated powder was compacted into a disk-shaped compact with a press forming machine at a pressure of 200 MPa.

The compact was placed in an electric furnace in an air atmosphere. The furnace was first heated to 600° C. and held at this temperature for 3 hours. Then, the compact was further heated up to a maximum temperature of 1340° C. and held for 5 hours, followed by cooking to 300° C. from 1340° C. at a rate of 100° C./h, thereby yielding a piezoelectric ceramic.

The resulting ceramic was subjected to measurements for the average equivalent circular diameter of the crystal grains and the relative density of the ceramic. The average equivalent circular diameter was 5.7 μm, and the relative density was 96.2%. For the observation of the crystal grains, a polarizing microscope was used. The photographic image taken through the polarizing microscope was processed for calculating the average equivalent circular diameter. For estimating the relative density, Archimedian method was used.

Subsequently, the composition of the ceramic was estimated by X-ray fluorescence analysis and ICP emission spectroscopy. It was thus found that the ceramic contained 0.24 parts by weight of Mn relative to 100 parts by weight of the metal oxide mainly containing barium titanate expressed by the chemical formula: $(Ba_{0.84}Ca_{0.16})_{1.006}(Ti_{0.94}Zr_{0.06})O_3$. This implies that the composition of the sintered ceramic corresponds to the proportions of the constituents weighed out. The contents of elements other than Ba, Ca, Ti, Zr and Mn were less than 0.001 parts by weight, lower than the detection limit.

Formation of Electrodes

The resulting ceramic was polished to a thickness of 0.5 mm, and then an Ag paste was applied to both sides of the ceramic and baked to form 3 μm thick electrodes. For baking, the Ag paste was heated to 800° C. at a rate of 5° C./min and held at 800° C. for 5 minutes. Then, the temperature was reduced to 40° C. at a cooling rate of 350° C./h, and the ceramic with the electrodes was taken out from the electric furnace.

Polarization

The resulting ceramic with the electrodes was cut into a strip of 10 mm×2.5 mm×0.5 mm in dimensions. The strip of the ceramic with the electrodes was placed on a hot plate heated to 140° C., and an electric field of 0.6 kV/mm was applied between the electrodes on both sides of the ceramic for 30 minutes. Then, the hot plate was cooled at a rate of 200° C./h. After the hot plate was cooled to 40° C., voltage application was stopped. Thus a piezoelectric element including a portion of a piezoelectric ceramic was completed.

Estimation of Remanent Polarization Direction

For estimating the remanent polarization of the resulting piezoelectric ceramic, the strip of the polarized piezoelectric element was cut out at an angle β (0°≤β<360°) as shown in FIG. 2. A first and a second Au electrode were formed by sputtering on the polarized ceramic, and the piezoelectric constant was measured with a d33 meter. When β=180°, the piezoelectric constant was the highest. This result shows that the remanent polarization direction of the piezoelectric ceramic of the piezoelectric element was perpendicular to the surfaces of the Ag electrodes.

Estimation of Crystal Structure

Subsequently, the crystal structure of the piezoelectric ceramic of the strip-shaped piezoelectric element was estimated. For the estimation, the measurement surface (of 2.5 mm×0.5 mm in dimensions) of the piezoelectric element along the remanent polarization direction was irradiated with X-ray radiation. The surface was measured with XRD (D8 ADVANCE manufactured by Bruker AXS) by the 2θ-θ method. More specifically, a Cu-Kα tube was used as the radiation source, and 2θ was set in the range of 20° to 50°. The scanning speed was set at 0.50°/min, and sampling was performed at intervals of 0.02°. The spot diameter of incident beam was 50 μm. The (002)/(200) diffraction intensity ratio of the measurement surface was 1.46; c/a was 1.007; the half-width of the (002) diffraction peak of the measurement surface was 0.36°. The room temperature at this time was 25° C.

Furthermore, the crystal structure of the surface (of 10 mm×2.5 mm in dimensions) of the piezoelectric ceramic intersecting the remanent polarization direction was estimated. First, the Ag electrodes were polished with an abrasive of #2000 in grit size to remove the Ag electrodes. The polished surfaces were buffed with colloidal silica. The crystal structure of the surface of the polished ceramic intersecting the remanent polarization direction was estimated under the same conditions as the crystal structure of the measurement surface. The (002)/(200) diffraction intensity ratio of the surface intersecting the remanent polarization direction was 1.21. The room temperature at this time was 25° C.

Electrical Properties

The strip-shaped piezoelectric element was measured for relative dielectric constant ∈r, electromechanical coupling factor $k_{31}$ and mechanical quality factor Qm with an impedance analyzer. The room temperature at this time was 25° C. The impedance analyzer was set to an application voltage of 0.05 Vpp. The relative dielectric constant ∈r was 1780; the electromechanical coupling factor $k_{31}$ was 0.219; and the mechanical quality factor Qm was 1700. For measuring the electromechanical coupling factor $k_{31}$ and the mechanical quality factor Qm, a resonance-anti-resonance method was applied.

The power consumption of the strip-shaped piezoelectric element was measured. The power consumption was measured with a power meter when an alternating voltage applied to the piezoelectric element was adjusted by varying the magnitude and frequency of the voltage so that the displacement of the piezoelectric element could be 1.0 μm. The displacement was measured with a laser Doppler vibrometer. The power consumption was 16 mW.

Examples 2 to 10

Ceramics of Examples 2 to 10 were prepared in the same manner as in Example 1, except that bismuth oxide was used as the raw material powder. The proportions of the constituents weighed out were as shown in Table 1. In Table 1, A1/B1 represents the ratio of the sum (A1) of the moles of Ba and Ca to the sum (B1) of the moles of Ti, Zr and Mn. Then, the average equivalent circular diameter and the relative density were estimated in the same manner as in Example 1. The results are shown in the Table 2. As a result of composition analysis performed in the same manner as in Example 1, the composition of the sintered ceramic corresponds to the proportions of the constituents weighed out in any sample.

Subsequently, piezoelectric elements were prepared in the same manner as in Example 1, and the remanent polarization direction, crystal structure, relative dielectric constant ∈r, electromechanical coupling factor $k_{31}$, mechanical quality factor Qm and power consumption of the piezoelectric ceramic of the piezoelectric element were measured. The room temperature at this time was 25° C. The results are shown in Tables 3 and 4.

Preparation and Evaluation of Piezoelectric Ceramic

Comparative Example 1

Raw material powders for the composition $(Ba_{0.90}Ca_{0.10})_{1.000}TiO_3$, which is a composition of the general formula $(Ba_{1-x}Ca_x)_q(Ti_{1-y}Zr_y)O_3$ in which x=0.10, y=0 and q=1.000, were weighed out as below.

Calcium carbonate powder, barium carbonate powder, titanium oxide powder, and manganese carbonate powder, each having a purity of 99.9% were weighed so as to satisfy the molar fractions of the above chemical formula.

Relative to 100 parts by weight of the metal oxide expressed by $(Ba_{0.90}Ca_{0.10})_{1.00}TiO_3$, manganese carbonate was weight in a proportion of 0.24 parts by weight in terms of Mn. All the powders weighed out were mixed in a wet manner in a ball mill for 16 hours. The resulting mixture was calcined at 1000° C. for 2 hours. After the calcined powder was pulverized for 8 hours in a wet process, 3 parts by weight of PVA binder relative to the calcined powder was applied to attach the binder to the surfaces of the powder for granulation, using a spray dryer.

The granulated powder was compacted into a disk-shaped compact with a press forming machine at a pressure of 200 MPa.

The compact was sintered in an air atmosphere in an electric furnace over a period of 48 hours in total, including being held at temperatures up to a maximum temperature of 1300° C. for 10 hours, thus yielding the ceramic of Comparative Example 1. For cooling the compact, the furnace was cooled from the maximum temperature.

The resulting ceramic was subjected to measurements for the average equivalent circular diameter of the crystal grains and the relative density of the ceramic. The average equivalent circular diameter was 12.5 μm, and the relative density was 92.0%. For the observation of the crystal grains, a polarizing microscope was used. The photographic image taken through the polarizing microscope was processed for calculating the average equivalent circular diameter. For estimating the relative density, Archimedian method was used.

Subsequently, the composition of the ceramic was estimated by X-ray fluorescence analysis and ICP emission spectroscopy. It was thus found that the ceramic contained 0.24 parts by weight of Mn relative to 100 parts by weight of the metal oxide expressed by the chemical formula: $(Ba_{0.90}Ca_{0.10})_{1.000}TiO_3$. This implies that the composition of the sintered ceramic corresponds to the proportions of the constituents weighed out. The contents of elements other than Ba, Ca, Ti and Mn were less than 0.001 parts by weight, lower than the detection limit.

Formation of Electrodes

The resulting ceramic was polished to a thickness of 0.5 mm, and then an Ag paste was applied to both sides of the ceramic and baked to form 3 μm thick electrodes. For baking, the Ag paste was heated to 600° C. at a rate of 5° C./min and held at 600° C. for 2 minutes. The heating was then stopped. Then, the temperature was reduced to 40° C. at a cooling rate of 50° C./h, and the ceramic was taken out from the electric furnace.

Polarization

The resulting ceramic with the electrodes was cut into a strip of 10 mm×2.5 mm×0.5 mm in dimensions. The strip-shaped ceramic with the electrodes was placed in a silicone oil bath heated to 70° C., and an electric field of 1.0 kV/mm was applied between the electrodes on both sides of the ceramic for 30 minutes. Then, after the ceramic was cooled at a rate of 50° C./h, voltage application was stopped. Thus a piezoelectric element including a portion of the piezoelectric ceramic of Comparative Example 1 was completed.

Estimation of Remanent Polarization Direction

For estimating the remanent polarization of the resulting piezoelectric ceramic, the strip-shaped polarized piezoelectric element was cut out at an angle β (0°≤β<360°) as shown in FIG. 2. A first and a second Au electrode were formed by sputtering on the polarized ceramic, and the piezoelectric constant was measured with a d33 meter. When β=180°, the piezoelectric constant was the highest. This result shows that the remanent polarization direction of the piezoelectric ceramic of the piezoelectric element was perpendicular to the surfaces of the Ag electrodes.

Estimation of Crystal Structure

Subsequently, the crystal structure of the piezoelectric ceramic of the strip-shaped piezoelectric element was estimated. For the estimation, the measurement surface (of 2.5 mm×0.5 mm in dimensions) of the piezoelectric element along the remanent polarization direction was irradiated with X-ray radiation. The surface was measured with XRD (D8 ADVANCE manufactured by Bruker AXS) by the 2θ-θ method. More specifically, a Cu-Kα tube was used as the radiation source, and 2θ was set in the range of 20° to 50°. The scanning speed was set at 0.50°/min, and sampling was performed at intervals of 0.02°. The spot diameter of incident beam was 50 μm. The (002)/(200) diffraction intensity ratio of the measurement surface was 0.91; c/a was 1.009; the half-width of the (002) diffraction peak of the measurement surface was 0.38°. The room temperature at this time was 25° C.

Furthermore, the crystal structure of the surface (of 10 mm×2.5 mm in dimensions) of the piezoelectric ceramic intersecting the remanent polarization direction was estimated. First, the Ag electrodes were polished with an abrasive of #2000 in grit size to remove the Ag electrodes. The polished surfaces were buffed with colloidal silica. The crystal structure of the surface of the polished ceramic intersecting the remanent polarization direction was estimated under the same conditions as the crystal structure of the measurement surface. The room temperature at this time was 25° C. The (002)/(200) diffraction intensity ratio of the surface intersecting the remanent polarization direction was 0.91.

Electrical Properties

The strip-shaped piezoelectric element was measured for relative dielectric constant ∈r, electromechanical coupling factor $k_{31}$ and mechanical quality factor Qm by an impedance analyzer. The room temperature at this time was 25° C. The impedance analyzer was set to an application voltage of 0.05 Vpp. The relative dielectric constant ∈r was 880; the electromechanical coupling factor $k_{31}$ was 0.119; and the mechanical quality factor Qm was 1700. For measuring the electromechanical coupling factor $k_{31}$ and the mechanical quality factor Qm, a resonance-anti-resonance method was applied.

The power consumption of the strip-shaped piezoelectric element was measured. The power consumption was measured with a power meter when an alternating voltage applied to the piezoelectric element was adjusted by varying the magnitude and frequency of the voltage so that the displacement of the piezoelectric element could be 1.0 μm. The displacement was measured with a laser Doppler vibrometer. The power consumption was 35 mW.

Preparation and Evaluation of Piezoelectric Ceramic

Comparative Example 2

To a perovskite-type metal oxide powder of 100 nm in particle size containing barium titanate produced by hydrothermal synthesis, 3 parts by weight of PVA binder was applied to attach the binder to the surfaces of the barium titanate powder for granulation, using a spray dryer.

The granulated powder was compacted into a disk-shaped compact with a press forming machine at a pressure of 200 MPa.

The compact was sintered to yield a ceramic in an electric furnace using the profile of first being heating to 1390° C. at a rate of 15° C./min, held at 1390° C. for 1 minute, cooled to 1190° C. at a rate of 30° C./min, held at 1190° C. for 4 hours, and further cooling to room temperature at a rate of 60° C./h.

The resulting ceramic was subjected to measurements for the average equivalent circular diameter of the crystal grains and the relative density of the ceramic. The average equivalent circular diameter was 8.1 μm, and the relative density was 94.9%. For the observation of the crystal grains, a polarizing microscope was used. The photographic image taken through the polarizing microscope was processed for calculating the average equivalent circular diameter. For estimating the relative density, Archimedian method was used.

Subsequently, the composition of the ceramic was estimated by X-ray fluorescence analysis and ICP emission spectroscopy. As a result, it was found that the ceramic was expressed by the chemical formula $Ba_{1.000}TiO_3$. This implies that the composition of the sintered ceramic corresponds to the proportions of the constituents weighed out. The contents of elements other than Ba and Ti were less than 0.001 parts by weight, lower than the detection limit.

Formation of Electrodes

The resulting ceramic was polished to a thickness of 0.5 mm, and then 400 nm thick gold electrodes were formed on both sides of the ceramic sheet by DC sputtering. In this instance, 30 nm thick adhesion layers were formed of titanium between the electrodes and the ceramic. The adhesion layers were formed without being heated. Also, the resulting gold electrodes were not heat-treated after being formed.

Polarization

The resulting ceramic with the electrodes was cut into a strip of 10 mm×2.5 mm×0.5 mm in dimensions. The strip of the ceramic with the electrodes was placed on a hot plate heated to 100° C., and an electric field of 1.0 kV/mm was applied between the electrodes on both sides of the ceramic for 30 minutes. Then, after the ceramic was cooled at a rate of 50° C./h, voltage application was stopped. Thus a piezoelectric element including a portion of the piezoelectric ceramic of Comparative Example 2 was completed.

Estimation of Remanent Polarization Direction

The remanent polarization direction of the resulting piezoelectric ceramic was estimated in the same manner as in Comparative Example 1. When β=180°, the piezoelectric constant was the highest. This result shows that the remanent polarization direction of the piezoelectric ceramic of the piezoelectric element was perpendicular to the surfaces of the Au electrodes.

Estimation of Crystal Structure

Subsequently, the crystal structure of the piezoelectric ceramic of the strip-shaped piezoelectric element of Comparative Example 2 was estimated in the same manner as in Comparative Example 1. The room temperature at this time was 25° C. The (002)/(200) diffraction intensity ratio of the measurement surface was 0.97; c/a was 1.009; the half-width of the (002) diffraction peak of the measurement surface was 0.13°. The (002)/(200) diffraction intensity ratio of the surface intersecting the remanent polarization direction was 0.96.

Electrical Properties

Subsequently, the relative dielectric constant ∈r, the electromechanical coupling factor $k_{31}$, the mechanical quality factor Qm and the power consumption were measured in the same manner as in Comparative Example 1. The room temperature at this time was 25° C. The relative dielectric constant ∈r was 3650; the electromechanical coupling factor $k_{31}$ was 0.188; the mechanical quality factor Qm was 280; and the power consumption was 72 mW.

Comparative Example 3

A compact was formed for producing a ceramic in the same manner as in Examples 1 to 10. The proportions of the constituents weighed out were as shown in Table 1.

The compact was sintered in an air atmosphere in an electric furnace over a period of 24 hours in total, including being held at temperatures up to a maximum temperature of 1440° C. for 5 hours, thus yielding a ceramic. For cooling the compact, the furnace was cooled from the maximum temperature.

The resulting ceramic was subjected to measurements for the average equivalent circular diameter and the relative density in the same manner as in Comparative Example 2. The results are shown in the Table 2.

Subsequently, the composition of the ceramic was estimated by X-ray fluorescence analysis and ICP emission spectroscopy. It was thus found that the ceramic contained 0.40 parts by weight of Mn relative to 100 parts by weight of the metal oxide expressed by the chemical formula: $(Ba_{0.84}Ca_{0.16})_{1.014}(Ti_{0.90}Zr_{0.10})O_3$. This implies that the composition of the sintered ceramic corresponds to the proportions of the constituents weighed out. The contents of elements other than Ba, Ca, Ti, Zr and Mn were less than 0.001 parts by weight, lower than the detection limit.

Formation of Electrodes

The resulting ceramic was polished to a thickness of 0.5 mm, and then 400 nm thick gold electrodes were formed on both sides of the ceramic sheet by DC sputtering. In this instance, 30 nm thick adhesion layers were formed of titanium between the electrodes and the ceramic. The adhesion layers were formed without being heated. Also, the resulting gold electrodes were not heat-treated after being formed.

Polarization

The resulting ceramic with the electrodes was cut into a strip of 10 mm×2.5 mm×0.5 mm in dimensions. The strip of the ceramic with the electrodes was placed on a hot plate heated to 100° C., and an electric field of 1.0 kV/mm was applied between the electrodes on both sides of the ceramic for 30 minutes. Then, after the ceramic was cooled at a rate of 50° C./h, voltage application was stopped. Thus a piezoelectric element including a portion of the piezoelectric ceramic of Comparative Example 3 was completed.

Estimation of Remanent Polarization Direction

The remanent polarization direction of the resulting piezoelectric ceramic was estimated in the same manner as in Comparative Example 1. When β=180°, the piezoelectric constant was the highest. This result shows that the remanent polarization direction of the piezoelectric ceramic of the piezoelectric element was perpendicular to the surfaces of the Au electrodes.

Estimation of Crystal Structure

Subsequently, the crystal structure of the piezoelectric ceramic of the strip-shaped piezoelectric element of Comparative Example 3 was estimated in the same manner as in Comparative Example 1. The room temperature at this time was 25° C. The (002)/(200) diffraction intensity ratio of the measurement surface was 1.19; c/a was 1.001; the half-width of the (002) diffraction peak of the measurement surface was 0.45°. The (002)/(200) diffraction intensity ratio of the surface intersecting the remanent polarization direction was 1.09.

Electrical Properties

Subsequently, the relative dielectric constant ∈r, the electromechanical coupling factor $k_{31}$, the mechanical quality factor Qm and the power consumption were measured in the same manner as in Comparative Example 1. The room temperature at this time was 25° C. The relative dielectric constant ∈r was 2520; the electromechanical coupling factor $k_{31}$ was 0.188; the mechanical quality factor Qm was 1810; and the power consumption was 31 mW.

TABLE 1

|  | x | y | q | Mn (parts by weight) | Bi (parts by weight) | A1/B1 |
|---|---|---|---|---|---|---|
| Example 1 | 0.160 | 0.060 | 1.006 | 0.24 | 0.00 | 0.997 |
| Example 2 | 0.140 | 0.070 | 1.002 | 0.16 | 0.03 | 0.996 |
| Example 3 | 0.125 | 0.060 | 0.998 | 0.04 | 0.28 | 0.996 |
| Example 4 | 0.140 | 0.074 | 1.012 | 0.36 | 0.44 | 0.997 |
| Example 5 | 0.300 | 0.045 | 1.002 | 0.12 | 0.00 | 0.998 |
| Example 6 | 0.180 | 0.041 | 1.004 | 0.14 | 0.60 | 0.998 |
| Example 7 | 0.160 | 0.060 | 1.016 | 0.50 | 0.15 | 0.996 |
| Example 8 | 0.160 | 0.060 | 1.003 | 0.12 | 0.80 | 0.998 |
| Example 9 | 0.000 | 0.000 | 1.002 | 0.10 | 0.00 | 0.998 |
| Example 10 | 0.100 | 0.000 | 1.000 | 0.24 | 0.00 | 0.990 |
| Comparative Example 1 | 0.100 | 0.000 | 1.000 | 0.24 | 0.00 | 0.990 |
| Comparative Example 2 | 0.000 | 0.000 | 1.000 | 0.00 | 0.00 | 1.000 |
| Comparative Example 3 | 0.160 | 0.100 | 1.016 | 0.40 | 0.00 | 1.000 |

TABLE 2

|  | Relative density (%) | Average grain size (μm) |
|---|---|---|
| Example 1 | 96.2 | 5.7 |
| Example 2 | 95.8 | 6.4 |
| Example 3 | 93.1 | 1.9 |
| Example 4 | 94.8 | 2.7 |
| Example 5 | 93.5 | 4.1 |
| Example 6 | 93.2 | 8.2 |
| Example 7 | 96.1 | 2.9 |
| Example 8 | 94.8 | 3.7 |
| Example 9 | 95.9 | 8.7 |
| Example 10 | 92.0 | 12.1 |
| Comparative Example 1 | 92.0 | 12.5 |
| Comparative Example 2 | 94.9 | 8.1 |
| Comparative Example 3 | 92.1 | 7.3 |

TABLE 3

|  | (002)/(200) Diffraction intensity ratio of measurement surface | c/a of measurement surface | (002) Half-width (°) of measurement surface | (002)/(200) Diffraction intensity ratio of surface intersecting remanent polarization direction | Remanent polarization direction | k31@25° C. | ∈r@25° C. | Qm@25° C. |
|---|---|---|---|---|---|---|---|---|
| Example 1 | 1.46 | 1.007 | 0.36 | 1.21 | Perpendicular to electrodes | 0.219 | 1780 | 1700 |
| Example 2 | 1.52 | 1.004 | 0.47 | 1.31 | Perpendicular to electrodes | 0.248 | 2080 | 1520 |
| Example 3 | 1.43 | 1.006 | 0.33 | 1.24 | Perpendicular to electrodes | 0.229 | 1850 | 490 |
| Example 4 | 1.42 | 1.005 | 0.31 | 1.26 | Perpendicular to electrodes | 0.245 | 2060 | 1810 |
| Example 5 | 1.37 | 1.008 | 0.33 | 1.16 | Perpendicular to electrodes | 0.214 | 1380 | 830 |
| Example 6 | 1.31 | 1.009 | 0.28 | 1.14 | Perpendicular to electrodes | 0.211 | 1460 | 860 |
| Example 7 | 1.24 | 1.007 | 0.26 | 1.03 | Perpendicular to electrodes | 0.202 | 1600 | 2170 |
| Example 8 | 1.42 | 1.007 | 0.25 | 1.25 | Perpendicular to electrodes | 0.244 | 1750 | 1320 |
| Example 9 | 1.18 | 1.010 | 0.33 | 1.08 | Perpendicular to electrodes | 0.201 | 2400 | 1620 |
| Example 10 | 1.06 | 1.009 | 0.34 | 1.04 | Perpendicular to electrodes | 0.131 | 920 | 2480 |
| Comparative Example 1 | 0.91 | 1.009 | 0.38 | 0.91 | Perpendicular to electrodes | 0.119 | 880 | 1700 |
| Comparative Example 2 | 0.93 | 1.009 | 0.13 | 0.96 | Perpendicular to electrodes | 0.188 | 3650 | 280 |
| Comparative Example 3 | 1.19 | 1.001 | 0.45 | 1.09 | Perpendicular to electrodes | 0.188 | 2520 | 1810 |

TABLE 4

| | Power consumption (mW) |
|---|---|
| Example 1 | 16 |
| Example 2 | 12 |
| Example 3 | 21 |
| Example 4 | 12 |
| Example 5 | 21 |
| Example 6 | 22 |
| Example 7 | 16 |
| Example 8 | 14 |
| Example 9 | 25 |
| Example 10 | 25 |
| Comparative Example 1 | 35 |
| Comparative Example 2 | 72 |
| Comparative Example 3 | 31 |

The results shown in Tables 1 to 4 will now be discussed. In comparison of electromechanical coupling factors $k_{31}$ among Examples 1 to 9 and Comparative Examples 1 to 3, the electromechanical coupling factors $k_{31}$ of the Examples are 0.201 or more. Accordingly, these Examples exhibited power consumptions of 25 mW or less, lower than the Comparative Examples.

In comparison among Examples 1 to 9, the power consumptions of Examples 1, 2, 4, 7, 8 and 9 were as low as 25 mW or less. This is probably because the mechanical quality factors Qm of these Examples were 1320 or more and higher than the other Examples.

In comparison between Example 10 and Comparative Example 1, the power consumption of Example 10 was lower than that of Comparative Example 1. Although the piezoelectric ceramics of Example 10 and Comparative Example 1 have the same composition, the (002)/(200) diffraction intensity ratio of the measurement surface was different from each other, and that of Comparative Example 1 was less than 1.0. Accordingly, the electromechanical coupling factor $k_{31}$ and the mechanical quality factor Qm were also different. In Comparative Example 1, since the electromechanical coupling factor $k_{31}$ was lower than that of Example 10, the voltage required for a displacement of 1.0 μm was increased. Accordingly, the capacitance electric power increases to increase the power consumption.

In Comparative Example 2 as well, the (002)/(200) diffraction intensity ratio at the measurement surface was less than 1.0, and accordingly the electromechanical coupling factor $k_{31}$ came to less than 0.200. Also, Comparative Example 2 exhibited a power consumption of 72 mW, larger than Comparative Example 1. This is probably because in Comparative Example 2, the mechanical quality factor was much lower than that of Comparative Example 1 and, accordingly, the driving electric power was increased to increase the power consumption.

Comparative Example 3 exhibited a c/a of less than 1.004. Also, Comparative Example 3 exhibited a power consumption of 31 mW larger than Examples 1 to 10. This is probably because the high relative dielectric constant of Comparative Example 3 increased the capacitance electric power thereof.

Preparation and Evaluation of Vibration Device

Example 11

A piezoelectric element was prepared by forming electrodes on the piezoelectric ceramic (thermal expansion coefficient: $8 \times 10^{-6}$ $K^{-1}$) of Example 1 and polarizing the ceramic, in the same manner as in Example 1. An invar diaphragm (thermal expansion coefficient: $1 \times 10^{-6}$ $K^{-1}$) of 10 mm×2.5 mm×2.5 mm in dimensions was bonded to the resulting piezoelectric element in a shape of strip of 10 mm×2.5 mm×0.5 mm in dimensions with an adhesive curable at room temperature. Thus a vibration device shown in FIG. 6 was prepared.

Subsequently, the crystal structure of the piezoelectric ceramic of the resulting vibration device was estimated. For the estimation, the measurement surface (of 2.5 mm×0.5 mm in dimensions) of the piezoelectric ceramic was measured at two points at the front surface and the bottom surface. The surface was measured with XRD (D8 ADVANCE manufactured by Bruker AXS) by the 2θ-θ method. More specifically, a Cu-Kα tube was used as the radiation source, and 2θ was set in the range of 20° to 50°. The scanning speed was set at 0.50°/min, and sampling was performed at intervals of 0.02°. The spot diameter of incident beam was 50 μm. The measurement was repeated 10 times, and measured (002)/(200) diffraction intensity ratios were averaged for estimation. The (002)/(200) diffraction intensity ratio B at the front surface was 1.37, and the (002)/(200) diffraction intensity ratio A at the bottom surface was 1.41. The room temperature at this time was 25° C.

The mechanical quality factor Qm of the vibration device, which was measured by a resonance-anti-resonance method, was 2200. Furthermore, the voltage at which the vibration speed could be 0.5 m/s was measured by applying an alternating voltage having a frequency around the resonance frequency. As a result, a voltage of 14 Vpp was used until reaching 0.5 m/s.

Example 12

A piezoelectric element was prepared by forming electrodes on the piezoelectric ceramic (thermal expansion coefficient: $8 \times 10^{-6}$ $K^{-1}$) of Example 1 and polarizing the ceramic, in the same manner as in Example 1. A SUS 420 diaphragm (thermal expansion coefficient: $9 \times 10^{-6}$ $K^{-1}$) of 10 mm×2.5 mm×2.5 mm in dimensions was bonded to the resulting piezoelectric element in a shape of strip of 10 mm×2.5 mm×0.5 mm in dimensions with an adhesive curable at room temperature to yield a vibration device shown in FIG. 6.

Subsequently, the crystal structure of the piezoelectric ceramic of the resulting vibration device was estimated in the same manner as in Example 11. The (002)/(200) diffraction intensity ratio B at the front surface was 1.37, and the (002)/(200) diffraction intensity ratio A at the bottom surface was 1.43. The room temperature at this time was 25° C.

The mechanical quality factor Qm of the vibration device, which was measured by a resonance-anti-resonance method, was 2300.

Furthermore, the voltage at which the vibration speed could be 0.5 m/s was measured by applying an alternating voltage having a frequency around the resonance frequency to the vibration device. As a result, a voltage of 12.5 Vpp was used until reaching 0.5 m/s.

Comparative Example 4

A piezoelectric element was prepared by forming electrodes on the piezoelectric ceramic (thermal expansion coefficient: $7.8 \times 10^{-6}$ $K^{-1}$) of Comparative Example 2 and polarizing the ceramic, in the same manner as in Example 1. A SUS 420 diaphragm (thermal expansion coefficient: $9 \times 10^{-6}$ $K^{-1}$) of 10 mm×2.5 mm×2.5 mm in dimensions was bonded to the resulting piezoelectric element in a shape of strip of 10 mm×2.5 mm×0.5 mm in dimensions with an adhesive curable at room temperature to yield a vibration device shown in FIG. 6.

Furthermore, the voltage at which the vibration speed could be 0.5 m/s was measured by applying an alternating voltage having a frequency around the resonance frequency to the vibration device. Although voltages up to 20 Vpp were applied, the vibration speed did not reach 0.5 m/s.

In comparison between Examples 11 and 12, the vibration speed of the vibration device using the SUS 420 diaphragm reached 0.5 m/s at lower voltage. Probably, this results from the difference in mechanical quality factor Qm between the vibration devices. This suggests that when the thermal expansion coefficient of the diaphragm is higher than that of the piezoelectric ceramic, the vibration device exhibits high driving efficiency.

Preparation and Evaluation of Liquid Ejecting Head

Example 13

A liquid ejecting head having the structure shown in FIG. 7B was prepared using the piezoelectric ceramic of Example 1. The liquid ejecting head ejected ink according to the electrical signal input.

Comparative Example 5

A liquid ejecting head having the structure shown in FIG. 7B was prepared using the piezoelectric ceramic of Comparative Example 3. The liquid ejecting head ejected ink according to the electrical signal input. The power consumption at this time was twice that of Example 13.

Preparation and Evaluation of Liquid Ejecting Apparatus

Example 14

A liquid ejecting apparatus having the structure shown in FIG. 8 was prepared using the liquid ejecting head of Example 13. The liquid ejecting apparatus ejected ink on a recording medium according to the electrical signal input Comparative Example 6

A liquid ejecting apparatus having the structure shown in FIG. 8 was prepared using the liquid ejecting head of Comparative Example 5. The liquid ejecting apparatus ejected ink on a recording medium according to the electrical signal input. The power consumption at this time was twice that of Example 14.

Preparation and Evaluation of Ultrasonic Motor

Example 15

An ultrasonic motor having the structure shown in FIG. 10 was prepared using the vibration device of the same material as in Example 11. The input voltage was controlled by applying a load of 150 g·cm so that the rotational speed could come to 100 rpm, and the efficiency at this time was measured. As a result, the efficiency was 11.1%.

Example 16

An ultrasonic motor having the structure shown in FIG. 10 was prepared using the vibration device of the same material as in Example 12. The input voltage was controlled by applying a load of 150 g·cm so that the rotational speed could come to 100 rpm, and the efficiency at this time was measured. As a result, the efficiency was 12.7%.

Comparative Example 7

An ultrasonic motor having the structure shown in FIG. 10 was prepared using the vibration device of the same material as in Comparative Example 4. For setting the rotational speed to 100 rpm, the input voltage was controlled by applying a load of 150 g·cm. The rotational speed however did not reach 100 rpm.

In comparison between Examples 15 and 16, the ultrasonic motor using the SUS 420 vibration device exhibited higher efficiency. Probably, this results from the difference in mechanical quality factor Qm between the vibration devices. This suggests that when the thermal expansion coefficient of the diaphragm is higher than that of the piezoelectric ceramic, the ultrasonic motor exhibits high driving efficiency.

Preparation and Evaluation of Optical Apparatus

Example 17

An optical apparatus having the structure shown in FIG. 11 was prepared using the ultrasonic motor of Example 16. The optical apparatus exhibited autofocus operation according to the alternating voltage applied.

Comparative Example 8

An optical apparatus having the structure shown in FIG. 11 was prepared using the ultrasonic motor of Comparative Example 7. The optical apparatus exhibited autofocus operation according to the alternating voltage applied. The power consumption at this time was 2.5 times that of Example 17.

Preparation and Evaluation of Dust removing Unit

Example 18

A dust removing unit having the structure shown in FIG. 13 was prepared using the piezoelectric ceramic of Example 1. Plastic beads were scattered and an alternating voltage was applied. The dust removing unit exhibited good dust removal.

Comparative Example 9

A dust removing unit having the structure shown in FIG. 13 was prepared using the piezoelectric ceramic of Comparative Example 3. Plastic beads were scattered and an alternating voltage was applied to remove dust. The power consumption at this time was twice that of Example 18.

Preparation and Evaluation of Image Sensing Apparatus

Example 19

An image sensing apparatus having the structure shown in FIG. 16 was prepared using the dust removing unit of Example 18. When the image sensing apparatus was operated, the dust on the surface of the image sensing unit was satisfactorily removed and images without defects resulting from dust were formed.

Comparative Example 10

An image sensing apparatus having the structure shown in FIG. 16 was prepared using the dust removing unit of Comparative Example 9. When the image sensing apparatus was operated, the dust on the surface of the image sensing unit was satisfactorily removed and images without defects resulting from dust were formed. The power consumption at this time was however twice that of Example 19.
Preparation and Evaluation of Electronic Apparatus Example 20

An electronic apparatus having the structure shown in FIG. 18 was prepared using the piezoelectric ceramic of Example 1. The electronic apparatus performed loudspeaking operation according to the alternating voltage applied.

Comparative Example 11

An electronic apparatus having the structure shown in FIG. 18 was prepared using the piezoelectric ceramic of Comparative Example 3. The electronic apparatus performed loudspeaking operation according to the alternating voltage applied. The power consumption at this time was twice that of Example 20.

The piezoelectric ceramic of an embodiment of the present application has a high mechanical quality factor, and accordingly piezoelectric elements using the piezoelectric ceramic can operate with low power consumption and high efficiency. In addition, the piezoelectric ceramic does not contain lead or alkali metals, having low environmental load. The piezoelectric ceramic of an embodiment of the present application can therefore be efficiently used for various apparatuses or devices including piezoelectric elements, such as liquid ejecting heads, ultrasonic motors, and dust removing units.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-014470 filed Jan. 29, 2014, which is hereby incorporated by reference herein in its entirety.

What is claimed is:

1. A piezoelectric ceramic having a remanent polarization, comprising:
 a perovskite-type metal oxide containing barium titanate; and Mn,
 wherein when a surface thereof along the direction of the remanent polarization is a measurement surface subjected to X-ray diffraction analysis at room temperature, the ratio of the diffraction intensity of the (002) plane of the measurement surface to the diffraction intensity of the (200) plane of the measurement surface is 1.0 or more, the diffraction peak of the (002) plane has a half width of 1.2° or less, and the lattice constant of the c-axis thereof and the lattice constant of the a-axis thereof satisfy the relationship $1.004 \leq c/a \leq 1.010$.

2. The piezoelectric ceramic according to claim 1, wherein the perovskite-type metal oxide is expressed by:

$$(Ba_{1-x}Ca_x)_q(Ti_{1-y}Zr_y)O_3 \quad (1)$$

wherein x represents a numeral satisfying $0.125 \leq x \leq 0.300$, y represents a numeral satisfying $0.041 \leq y \leq 0.074$, and q represents a numeral satisfying $0.986 \leq q \leq 1.020$.

3. The piezoelectric ceramic according to claim 1, wherein the content of the Mn in terms of metal is in the range of 0.04 parts by weight to 0.50 parts by weight relative to 100 parts by weight of the perovskite-type metal oxide.

4. The piezoelectric ceramic according to claim 1, further comprising Bi.

5. The piezoelectric ceramic according to claim 4, wherein the content of the Bi in terms of metal is in the range of 0.04 parts by weight to 0.80 parts by weight relative to 100 parts by weight of the perovskite-type metal oxide.

6. The piezoelectric ceramic according to claim 1, wherein the piezoelectric ceramic has an electromechanical coupling factor of 0.200 or more.

7. The piezoelectric ceramic according to claim 1, wherein the piezoelectric ceramic has a mechanical quality factor of 400 or more.

8. The piezoelectric ceramic according to claim 1, wherein the piezoelectric ceramic has a relative dielectric constant of 2500 or less at room temperature.

9. A method for manufacturing the piezoelectric ceramic as set forth in claim 1, the method comprising:
 forming a compact of a raw material powder; and
 sintering the compact to yield the piezoelectric ceramic,
 wherein the sintering of the compact includes heating the compact at temperatures up to a maximum temperature of 1100° C. to 1400° C., and cooling the compact at a cooling rate of 50° C./h or more.

10. A piezoelectric element comprising:
 a first electrode;
 a piezoelectric material portion made of the piezoelectric ceramic as set forth in claim 1; and
 a second electrode,
 wherein the first and the second electrode intersect the direction of the remanent polarization.

11. A method for manufacturing the piezoelectric element as set forth in claim 10, the method comprising:
 forming a compact of a raw material powder;
 sintering the compact to yield a piezoelectric ceramic;
 forming a first and a second electrode on the piezoelectric ceramic; and
 polarizing the piezoelectric ceramic,
 wherein the forming of the first and the second electrode includes heating the piezoelectric ceramic and the first and second electrodes at temperatures up to a maximum temperature of 700° C. to 900° C., and cooling the piezoelectric ceramic and the first and second electrodes at a rate of 100° C./h or more.

12. The method according to claim 11, wherein the polarizing of the piezoelectric ceramic includes heating the piezoelectric ceramic, applying a direct voltage to the piezoelectric ceramic, and then cooling the piezoelectric ceramic at a rate of 100° C./h or more while keeping applying the voltage.

13. A vibration device comprising:
 the piezoelectric element as set forth in claim 10; and
 a diaphragm on which the piezoelectric element is disposed,
 wherein when the surface of the piezoelectric ceramic of the piezoelectric material portion closer to the diaphragm is the bottom surface thereof and the surface of the piezoelectric ceramic opposite the bottom surface is the front surface thereof, the (002)/(200) diffraction intensity ratio A of the measurement surface in the vicinity of the bottom surface and the (002)/(200) diffraction intensity ratio B of the measurement surface in the vicinity of the front surface satisfy the relationship A>B at room temperature.

14. The vibration device according to claim 13, wherein the piezoelectric ceramic of the piezoelectric material portion and the diaphragm satisfy the relationship: $\alpha_1 < \alpha_2$, wherein $\alpha_1$ represents the thermal expansion coefficient of the piezoelectric ceramic at room temperature and $\alpha_2$ represents the thermal expansion coefficient of the diaphragm at room temperature.

15. A liquid ejecting head comprising:
a liquid chamber including a vibration portion provided with the piezoelectric element as set forth in claim 10; and
a portion defining an ejection opening communicating with the liquid chamber.

16. A liquid ejecting head comprising:
a liquid chamber including a vibration portion provided with the vibration device as set forth in claim 13; and
a portion defining an ejection opening communicating with the liquid chamber.

17. A liquid ejecting apparatus comprising:
a portion on which a transfer medium is placed; and
the liquid ejecting head as set forth in claim 15.

18. An ultrasonic motor comprising:
the vibration device as set forth in claim 13; and
a moving device in contact with the vibration device.

19. An optical apparatus comprising:
a driving portion provided with the ultrasonic motor as set forth in claim 18.

20. A vibration unit comprising:
a vibration device including the piezoelectric element as set forth in claim 10 and a diaphragm on which the piezoelectric element is disposed.

21. A vibration unit comprising the vibration device as set forth in claim 13.

22. A dust removing unit comprising a vibration portion including the vibration unit as set forth in claim 20.

23. An image sensing apparatus comprising:
a dust removing unit as set forth in claim 22; and
an image sensing element unit having a light-receiving face,
wherein the dust removing unit is disposed at the light-receiving face.

24. An electronic apparatus comprising a piezoelectric acoustic component including the piezoelectric element as set forth in claim 10.

* * * * *